United States Patent [19]
Hayashi

[11] Patent Number: 5,600,664
[45] Date of Patent: Feb. 4, 1997

[54] INFORMATION REPRODUCING APPARATUS

[75] Inventor: Nobuhiro Hayashi, Kanagawa, Japan

[73] Assignee: Sony Corporation, Tokyo, Japan

[21] Appl. No.: 331,545

[22] PCT Filed: Mar. 1, 1994

[86] PCT No.: PCT/JP94/00330

§ 371 Date: Nov. 1, 1994

§ 102(e) Date: Nov. 1, 1994

[87] PCT Pub. No.: WO94/20961

PCT Pub. Date: Sep. 15, 1994

[30]  Foreign Application Priority Data

Mar. 2, 1993  [JP]  Japan ..................... 5-066247

[51] Int. Cl.$^6$ ............ G06F 11/10; H03M 13/12; G11B 27/36; H04N 5/76
[52] U.S. Cl. ................................. 371/43; 369/60
[58] Field of Search ............... 371/37.1, 43; 375/262, 375/263; 360/18, 27; 369/60

[56]  References Cited

U.S. PATENT DOCUMENTS

| | | | |
|---|---|---|---|
| 3,851,306 | 11/1974 | Patel | 371/40.3 |
| 5,220,568 | 6/1993 | Howe et al. | 371/37.1 |
| 5,329,535 | 7/1994 | Coker | 371/39.1 |

FOREIGN PATENT DOCUMENTS

| | | | |
|---|---|---|---|
| 63-299412 | 12/1988 | Japan | H03M 13/12 |
| 3-236633 | 10/1991 | Japan | H03M 13/12 |
| 3-232320 | 10/1991 | Japan | H03M 13/12 |
| 4-170227 | 6/1992 | Japan | H03M 13/12 |
| 4-34333 | 6/1992 | Japan | H03M 13/12 |
| 5-37402 | 2/1993 | Japan | H03M 13/12 |
| 5-206872 | 8/1993 | Japan | H03M 13/12 |
| 5-314676 | 11/1993 | Japan | G11B 20/18 |
| 5-325433 | 12/1993 | Japan | G11B 20/18 |
| 6-36476 | 2/1994 | Japan | G11B 20/18 |

*Primary Examiner*—Roy N. Envall, Jr.
*Assistant Examiner*—Emmanuel L. Moise
*Attorney, Agent, or Firm*—Limbach & Limbach L.L.P.

[57]  ABSTRACT

The information reproducing apparatus according to the present invention is the information reproducing apparatus which reproduces the data from the recording medium by utilizing the partial response system and decodes the data by using the shift register on the basis of the Viterbi decoding method, wherein the shift register includes the flip-flops $Da_j$ as the plurality of latch means connected in series for latching the data and the XOR gates $31a$ to $31d$ as the arithmetic means which are disposed between the adjacent flip-flops $Da_j$ to carry out CRC calculation and which calculates the exclusive-ORs of the outputs of the flip-flops $Da_j$.

9 Claims, 16 Drawing Sheets

FIG. 3A  input_a
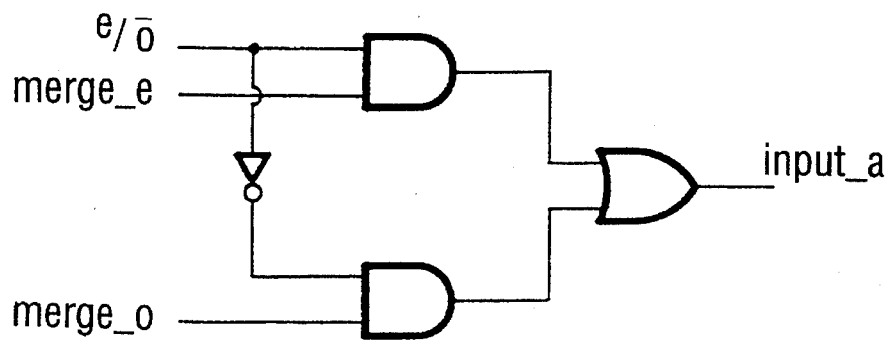
FIG. 3B  input_b
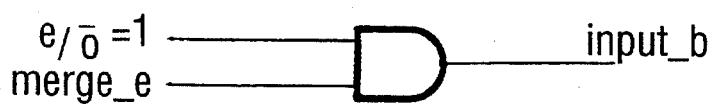
FIG. 3C  input_c
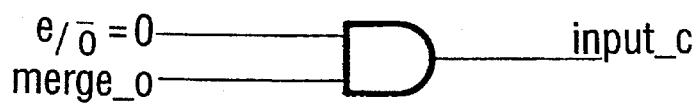
FIG. 3D  input_d
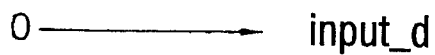

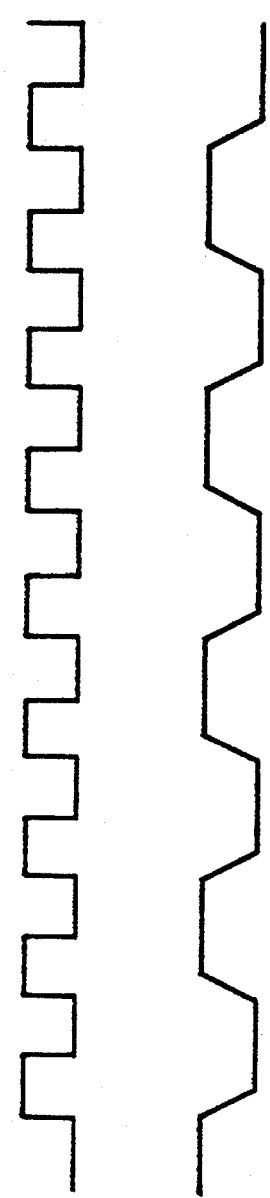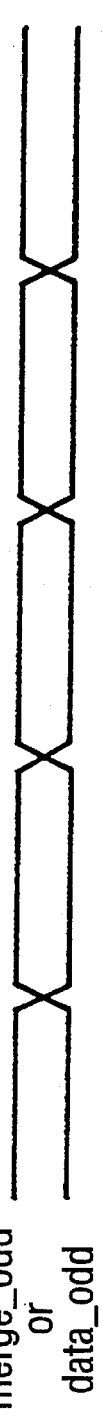
FIG. 4A  clock
FIG. 4B  even/$\overline{odd}$
FIG. 4C  merge_even or data_even
FIG. 4D  merge_odd or data_odd

INPUT, OUTPUT

FIG. 11
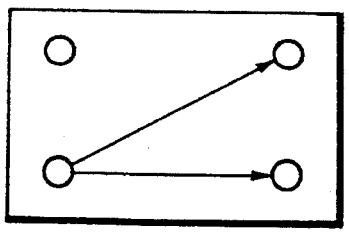
β = +1
$y_k - y_p \geqq 0$
$y_p \leftarrow y_k$
$\beta \leftarrow +1$
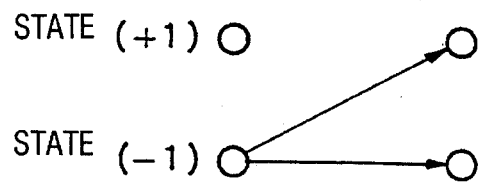
STATE (+1)
STATE (−1)
$-2 \geqq y_k - y_p < 0$
$y_p \leftarrow y_p$
$\beta \leftarrow \beta$
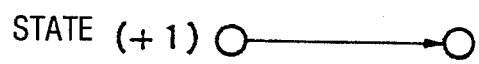
STATE (+1)
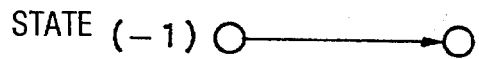
STATE (−1)
$y_k - y_p < 2$
$y_p \leftarrow y_k$
$\beta \leftarrow -1$
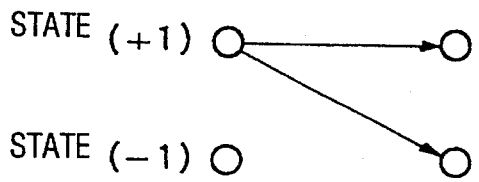
STATE (+1)
STATE (−1)

INFORMATION REPRODUCING APPARATUS

TECHNICAL FIELD

The present invention relates to an information reproducing apparatus suitable for use in a case where information recorded on, for example, a magnetic disc, a magnetic tape, an optical disc, a magneto-optical disc and so on is decoded with a maximum likelihood decoding method such as a Viterbi decoding method or the like.

BACKGROUND ART

A partial response is used as a modulation code used in a magnetic recording and reproducing apparatus or an optical recording and reproducing apparatus. Of kinds of the partial response, PRS (1,1) (class I), PRS (1,–1), PRS (1,0 –1) (class IV) and so on are used frequently. An arithmetic circuit 101 shown in FIG. 6(a) uses the PRS (1,0,–1). Arithmetic circuits 102, 103 shown in FIG. 6(b) use the PRS (1,–1). A system polynomial G(D) of the PRS (1,0,–1) is $G(D)=1-D^2$ and a system polynomial G(D) of the PRS (1,–1) is G(D)=1+D, where reference letter D represents a delay operator.

The arithmetic circuit 101 is a circuit which successively outputs data of 1, 0 and –1 when an independent logic 1 is input. The arithmetic circuits 102, 103 are circuits which successively output data of 1 and –1 when an independent logic 1 is input.

The arithmetic circuit 101 (PRS(1,0,–1)) shown in FIG. 6(a) has the system polynomial of $G(D)=1-D^2$ and hence always calculates input data $y_k$ inputted at a certain sampling time k as a two previous sample $y_{k-2}$. Accordingly, an odd number sample and an even number sample are substantially independent of each other and can be regarded as independent series of the partial response PRS (1,–1). The circuit shown in FIG. 6(a) is equivalent to a circuit shown in FIG. 6(b) in which the odd and even number samples of input data are respectively supplied to and processed by the arithmetic circuits 102, 103 for calculating the partial response PRS (1,–1) by switching a switch 104 and outputs of the arithmetic circuits are synthesized by a switch 105 to be output.

Decoding in which the arithmetic circuits 102, 103 (PRS (1,–1)) are used with being interleaved is substantially the same as decoding carried out by the arithmetic circuit 101 (PRS(1,0,–1)). Here, the partial response PRS (1,0,–1) will be explained by way of example.

The partial response PRS (1,0,–1) itself has the property of permitting an error to be propagated and, hence, one bit error caused under a certain condition, may cause a fatal error. Therefore, in order to prevent such an error from being caused, it is necessary to pre-code data before recording them. This pre-coding can be carried out by effecting a reverse conversion of the partial response.

FIG. 7 shows a total arrangement of a conventional for modulating and demodulating the partial response through such precoding. In FIG. 7, a pre-coder 111 carries out a process of $1/(1-D^2)$.

Recorded data are converted by the pre-coder 111 into pre-coded data varying between a value 1 of the recorded data and a value –1 thereof by utilizing a correlation between data of the recorded data. The thus converted data are output to a recording channel circuit 112.

The recording channel circuit 112 is not an explicitly provided circuit rather a function which is inherently possessed by a magnetic recording and reproducing system and is represented in FIG. 7 as an equivalent circuit. In this circuit (that is, when the data are magnetically recorded and then reproduced), an arithmetic processing circuit 113 subject the output from the pre-coder 111 to an arithmetic processing of (1–D).

At this time, a noise generated in a practical magnetic recording channel is treated as one to be added to a result of the calculation by an adder 114. Data to which the noise is added (data reproduced after magnetically recorded) are from the recording channel circuit 12 an arithmetic processing circuit 115. The arithmetic processing circuit 115 subjects the output from the recording channel circuit 112 to an arithmetic processing of (1+D).

As shown in FIG. 8, a signal output from the recording channel circuit 112 is set at any one of three levels of {–2,0,+2} if the input signal level ranges between values ±2. When the signal is decoded by a decoder 116 (FIG. 7) so as to be an original binary data (1 or 0), it can be considered to take a three-level detecting method using fixed threshold values or a Viterbi decoding which is a maximum likelihood decoding method.

The three-level detecting method is a method in which two threshold levels having predetermined fixed values are respectively set between values 0 and +2 and between values 0 and –2 and data are decoded by determining whether a signal level sampled at a sample point is larger or smaller than the threshold levels. The method has an advantage such that the circuit can be very simplified, but it also has a disadvantage such that a detection ability is comparatively low.

On the other hand, the maximum likelihood decoding method (the Viterbi decoding) is a method in which data are decoded by using values at previous and subsequent sample points to detect a series (path) of the data obtained after being decoded and a maximum likelihood series (path) is estimated on the basis thereof. As compared with the three-level detecting method, the maximum likelihood decoding method has high detection ability and can reduce a bit error rate to an extent from two figures to one figure when the same data are decoded by both of the methods.

Next, there will be described an example of a circuit used when the decoder 116 is formed of a Viterbi decoder. Before the circuit is explained, the Viterbi decoding will be explained. Having the system polynomial of $1-D^2$, a system using the PRS (1,0,–1) has four states. If data are derived from the system at every other bit, then such derived data form one system (that is, PRS(1,–1)), which has two states because its system polynomial is 1–D.

A state transition diagram of the PRS (1,–1) is shown in FIG. 9. If a value 1 is input when the state of the PRS (1,–1) is $a_{k-2}=-1$, then the state thereof is changed to $a_k=+1$ and a value 2 is output. If a value –1 is input, then the state thereof is changed to the same state as an original state thereof, i.e., a state of $a_k=+1$ and a value 0 is output. Further, if a value 1 is input when the state thereof is $a_{k-2}=+1$, then the state thereof is changed to $a_k=-1$ and a value –2 is output. If a value –1 is input, then the state thereof is changed to the same state as an original state thereof, i.e., a state of $a_k=-1$ and a value 0 is output.

A trellis diagram (likelihood seeking diagram) (hereinafter referred to as a trellis) corresponding to the state transition diagram shown in FIG. 9 is shown in FIG. 10. In the trellis, if a sample value (which is the output from the arithmetic processing circuit 115 in this case) $y_k$ is input at a certain sampling time k, a branch metric (which corresponds to an instantaneous standard of a likelihood) from the state of $a_k-2$ to a state of $a_k$ is indicated in the form of a value obtained by multiplying a squared error of the sample value $y_k$ by $-1$ $(-(y_2-0)^2, -(y_2-2)^2, -(y_2+2)^2, \ldots)$.

The Viterbi decoding finds a path through which a sum of all the branch metrics becomes maximum. Respective path metrics (which correspond to integrals of likelihood path) $L_k+$ and $L_k-$ up to a certain sampling time k under the states of $a_k=+1$ and $a_k=-1$ can be represented by using values $L_{k-2}$ of the path metrics up to one previous sampling time k–2 as shown in the following equations (1) and (2).

$$L_k+ = max \{L_{k-2}+ +[-(y_k-0)^2], L_{k-2}- +[-(y_k-2)^2]\} \quad (1)$$

$$L_k- = max \{L_{k-2}+ +[-(y_k+2)^2], L_{k-2}- +[-(y_k-0)^2]\} \quad (2)$$

Here, max {A,B} represents selection of larger number between the values A and B.

In order to detect a most proper path while computing the metric, three squaring circuits, six adders and two comparators are generally required. Then, instead of calculating every path metric accurately, an algorithm in which a differential metric is used can be used in order to simplify the circuit.

A Viterbi algorithm used when there are only two states will be considered. The Viterbi algorithm is operated such that it determines data while selecting one path in which likelihood in reaching each state at a certain time k becomes largest. The above-mentioned decoding circuit (decoder 116) is used to realize the Viterbi algorithm accurately.

Difference between path metrics (a differential metric) in the states of $a_k=+1, -1$ can be expressed by the following equation:

$$\Delta L_k = L_k+ - L_k- \quad (3).$$

In case of $$L_{k-2}+ +[-(y_k-0)^2] > L_{k-2}- +[-(y_k-2)^2]$$

(the case of large likelihood in transition from a state of $a_{k-2}=+1$ to a state of $a_k=+1$), the path metric $L_k+$ is determined from equation (1) as $$L_{k-2}+ +[-(y_k-0)^2].$$

In case of $$L_{k-2}+ +[-(y_k-0)^2] \leq L_{k-2}- +[-(y_k-2)^2]$$

(the case of large likelihood in transition from a state of $a_{k-2}=-1$ to the state of $a_k=+1$), the path metric $L_k+$ is determined therefrom as $$L_{k-2}- +[-(y_k-2)^2].$$

On the other hand, in case of $$L_{k-2}+ +[-(y_k+2)^2] > L_{k-2}- +[-(y_k-0)^2]$$

(the case of large likelihood in transition from the state of $a_{k-2}=+1$ to a state of $a_k=-1$), the path metric $L_k-$ is determined from equation (2) as $$L_{k-2}+ +[-(y_k+2)^2].$$

In case of $$L_{k-2}+ +[-(y_k+2)^2] \geq L_{k-2}- +[-(y_k-0)^2]$$

(the case of large likelihood in transition from the state of $a_{k-2}=-1$ to the state of $a_k=-1$), the path metric $L_k-$ is determined therefrom as $$L_{k-2}- +[-(y_k-2)^2].$$

To summarize them, the path metric $L_k+$ has two different values obtained in case of $$4 > 4y_k - \Delta L_{k-2} \quad (C+1)$$

(case of large likelihood in transition from the state of $a_{k-2}=+1$ to the state of $a_k=+1$) and in case of $$4 \geq 4y_k - \Delta L_{k-2} \quad (C+2)$$

(case of large likelihood in transition from the state of $a_{k-2}=-1$ to the state of $a_k=+1$). The path metric $L_k-$ has two different values obtained in case of $$-4 > 4y_k - \Delta L_{k-2} \quad (C-1)$$

(case of large likelihood in transition from the state of $a_{k-2}=+1$ to the state of $a_k=-1$) and in case of $$-4 \geq 4y_k - \Delta L_{k-2} \quad (C-2)$$

(case of large likelihood in transition from the state of $a_{k-2}=-1$ to the state of $a_k=-1$).

Accordingly, the differential metric $\Delta L_k$ expressed in equation (3) is varied depending upon each of four cases (=2×2), i.e., cases of (C+1) and (C-1), (C+2) and (C-2), (C+1) and (C-2), and (C+2) and (C-1).

In case of $4 > 4y_k - \Delta L_{k-2}$ and $-4 > 4y_k - \Delta L_{k-2}$ (case of a survivor path becoming a pattern of a state <+1> → the state <+1> and of the state <+1> → a state <-1>), i.e., of $-4 > 4y_k - \Delta L_{k-2}$, the differential metric $\Delta L_k$ is $$\begin{aligned} \Delta L_k &= \{L_{k-2+} + [-(y_k-0)^2]\} - \{L_{k-2+} + [-(y_k+2)^2]\} \\ &= L_{k-2+} - y_k^2 - L_{k-2+} + y_k^2 + 4y_k + 4 \\ &= 4y_k + 4. \end{aligned}$$

Further, in case of $4 \geq 4y_k - \Delta L_{k-2}$ and $-4 \geq 4y_k - \Delta L_{k-2}$ (case of a survivor path becoming a pattern of the state <-1> → the state <-1> and of the state <-1> → the state <+1>), i.e., of $4 \geq 4y_k - \Delta L_{k-2}$, the differential metric $\Delta L_k$ is $$\begin{aligned} \Delta L_k &= \{L_{k-2-} + [-(y_k-2)^2]\} - \{L_{k-2-} + [-(y_k+0)^2]\} \\ &= L_{k-2-} - y_k^2 + 4y_k - 4 - L_{k-2-} + y_k^2 \\ &= 4y_k - 4. \end{aligned}$$

In case of $4 > 4y_k - \Delta L_{k-2}$ and $-4 \geq 4y_k - \Delta L_{k-2}$ (case of a survivor path becoming a pattern of the state <-1> → the state <-1> and the state <+1> → the state <+1>), i.e., of $-4 \geq 4y_k - \Delta L_{k-2} < 4$, the differential metric $\Delta L_k$ is $$\begin{aligned} \Delta L_k &= \{L_{k-2+} + [-(y_k-0)^2]\} - \{L_{k-2-} + [-(y_k-0)^2]\} \\ &= L_{k-2+} - y_k^2 - L_{k-2-} + y_k^2 \\ &= \Delta L_{k-2}. \end{aligned}$$

In case of $4 \geq 4y_k - \Delta L_{k-2}$ and $-4 > 4y_k - \Delta L_{k-2}$ (case of a survivor path becoming a pattern of the state <-1> → the state <-1> and of the state <+1> → the state <+1>), summarization of these equations indicates $4 \geq 4y_k - \Delta L_{k-2} < -4$. Therefore, the above case cannot happen.

Judging from the above description, equation (3) can give a value of $\Delta L_k$ depending upon size of the term $4y_k - \Delta L_{k-2}$ and the value is given as shown in the following equation (4).

$$\Delta L_k = \begin{cases} 4y_k - 4, & \text{in case of } 4 \leq 4y_k - \Delta L_{k-2} \\ \Delta L_{k-2}, & \text{in case of } -4 \leq 4y_k - \Delta L_{k-2} < 4 \\ 4y_k + 4, & \text{in case of } 4y_k - \Delta L_{k-2} < -4 \end{cases} \quad (4)$$

Accordingly, in case of only two states (of $a_k=+1$ and $a_k=-1$), only the following three kinds of survivor path patterns are possible;

the state <−1>→ the state <−1> and the state <−1>→ the state <+1>;

the state <−1>→ the state <−1> and the state <+1>→ the state <+1>; and the state <+1>→ the state <+1> and the state <+1>→ the state <−1>.

Here, the three kinds of possible survivor path patterns are represented by three kinds of two-letter symbols, i.e., →↑, →→ and →↓.

Since inequalities used for discrimination of cases in equation (4) include a term of $4y_k - \Delta L_{k-2}$ as a common comparative element, the value of the term is compared with a value 4 or −4 to determine size of the value. Therefore, it can be determined which of the above survivor path patterns the survivor path pattern is. In other words, calculation of the differential metric permits a survivor path, which survives in a process of the calculation, to be determined without calculating the path metric itself, and data can be decoded on the basis of the obtained survivor path.

When the value of the differential path metric is transformed by change of variables to $\Delta L_k = 4y_p - 4\beta$ with setting a value $y_p$ as a sample value at a point (location P) where any one of paths except a parallel path (→→), i.e., an upward divergence (→↑) or a downward divergence (→↓) occurs in the trellis and with setting a value $\beta$ as a so-called correction term, equation (4) can be expressed as shown in the following equation (5).

$$y_p - \beta = \begin{cases} y_k - 1, & \text{in case of } -\beta + 1 \leq y_k - y_p \\ y_p - \beta, & \text{in case of } -\beta - 1 \leq y_k - y_p < -\beta - 1 \\ y_k + 1, & \text{in case of } y_k - y_p < -\beta - 1 \end{cases} \quad (5)$$

When left and right sides of equation (5) are compared, if an upper or lower equality therein is established, i.e., the upward divergence (→↑) or the downward divergence (→↓) of the survivor path pattern occurs, it is understood that the value $\beta$ has a value 1 or −1.

Accordingly, the value $\beta$ represents a divergence direction at the point (location p) where the first upward divergence (→↑) or the first downward divergence (→↓) caused before the present point occurs (whether the survivor path pattern at the point (location p) is one of the upward divergence (→↑) or the downward divergence (→↓).

If the first divergence caused before the present point is the upward divergence (→↑), for example, i.e., if $\beta=+1$ is established, then the survivor path pattern at the present point is determined as the upward divergence (→↑) in case of $0 \leq y_k - y_p$, the parallel path (→→) in case of $-2 \leq y_k - y_p < 0$, and the downward divergence (→↓) in case of $y_k - y_p < -2$ by substituting a value 1 for the value $\beta$ in the inequality of equation (5) used for discrimination of cases (FIG. 11).

Further, in this case, when the left and right sides of equation (5) are compared, the values $\beta$ and $y_p$ are updated in a manner of $y_p \leftarrow y_k$ and $\beta \leftarrow +1$ in case of $0 \leq y_k - y_p$, $y_p \leftarrow y_p$ and $\beta \leftarrow \beta$ in case of $-2 \leq y_k - y_p < 0$, and $y_p \leftarrow y_k$ and $\beta \leftarrow -1$ in case of $y_k - y_p -2$ (FIG. 11).

Similarly, if the first divergence caused before the present point is the downward divergence (→↓), for example, i.e., if $\beta=-1$ is established, then the survivor path pattern at the present point is determined as the upward divergence (→↑) in case of $2 \leq y_k - y_p$, the parallel path (→→) in case of $0 \leq y_k - y_p < 2$, and the downward divergence (→↓) in case of $y_k - y_p < 0$ by substituting a value 1 for the value $\beta$ in the inequality of equation (5) used for discrimination of cases. When the left and right sides of equation (5) are compared, the values $\beta$ and $y_p$ are updated in a manner of $y_p \leftarrow y_k$ and $\beta \leftarrow +1$ in case of $2 \leq y_k - y_p$, $y_p \leftarrow y_p$ and $\beta \leftarrow \beta$ in case of $0 \leq y_k - y_p < 2$, and $y_p \leftarrow y_k$ and $\beta \leftarrow -1$ in case of $y_k - y_p < 0$.

Accordingly, what the value $\beta$ means in view of equation can be regarded as a role of adding an offset to a threshold value used for determination (this point will be described later on with reference to Tables 1 and 2).

When the upward divergence (→↑) or the downward divergence (→↓) of the survivor path pattern occurs, there can be confirmed a path to the point (location k) from the point (location p), where a divergence previous to one at the point (location k) thereof, occurs. Repetition of this confirmation allows data to be decoded.

FIG. 12 is a block diagram showing the decoder 116 for decoding the data on the basis of the above-described Viterbi algorithm. Reproduced data supplied from the recording channel circuit 112 (shown in FIG. 7) are input to a processing circuit 120 or 130, which processes independently an odd string sample or an even string sample thereof. Then, the respective samples are rearranged into their original orders by a synthesizing circuit 141 on the basis of the timing of a change-over signal output by the change-over circuit 1. The thus rearranged samples are.

FIG. 12 shows the detailed arrangement of the processing circuit 120 for processing the even string sample, while it is understood that the processing circuit 130 for processing the odd string sample is similarly arranged.

In the processing circuit 120, the reproduced data supplied from the recording channel circuit 112 are supplied to a subtracting circuit 11 and a register 12b through a switch 14 which is turned on/off at a timing of the odd string sample/the even string sample in response to the change-over signal output by the change-over circuit 1. In other words, the even string sample of the reproduced data are supplied to the subtracting circuit 11 and the register 12b.

The register 12b stores the sample value $y_p$ at one previous divergence point. The subtracting circuit 11 subtracts the value $y_p$ stored in the register 12b from an input even string sample $y_k$ (calculates $(y_k - y_p)$) and outputs a result of the subtraction to a comparing circuit 13.

The comparing circuit 13 carries out arithmetic processings shown in Tables 1 and 2 in response to the threshold values +2, 0 and −2, the output of the subtracting circuit 11 $(y_k - y_p)$ and the value of a previous $\beta$, stored in the register 12a, outputting output data shown in Tables 1 and 2 in response to a result of the calculation.

This calculation will be described in detail later on with reference to FIGS. 14 and 15.

TABLE 1

| | when $\beta = 1$ is established | | |
|---|---|---|---|
| input condition | $y_k - y_p < -2$ | $-2 \leq y_k - y_p < 0$ | $0 \leq y_k - y_p$ |
| condition pattern | A | B | C |
| rule of update | $y_p \leftarrow y_k$ $\beta \leftarrow -1$ | $y_k \leftarrow y_p$ $\beta \leftarrow \beta$ | $y_p \leftarrow y_k$ $\beta \leftarrow +1$ |
| output data | new $\beta = -1$ merge = 1 data = 1 | new $\beta = *$ merge = 0 data = 0 | new $\beta = 1$ merge = 1 data = 0 |

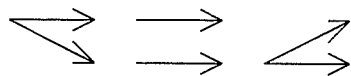

TABLE 2

| | when $\beta = -1$ is established | | |
|---|---|---|---|
| input condition | $y_k - y_p < 0$ | $0 < y_k - y_p \leq 2$ | $2 \leq y_k - y_p$ |
| condition pattern | D | E | F |
| rule of update | $y_p \leftarrow y_k$ $\beta \leftarrow -1$ | $y_p \leftarrow y_p$ $\beta \leftarrow \beta$ | $y_p \leftarrow y_k$ $\beta \leftarrow +1$ |
| output data | new $\beta = -1$ merge = 1 data = 0 | new $\beta = *$ merge = 0 data = 0 | new $\beta = 1$ merge = 1 data = 1 |

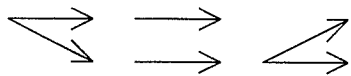

As shown in FIG. 13, a shift register 121 is formed as a parallel load/serial shift register arranged such that there are connected in parallel to each other a shift register, in which N selectors $Sp_1$ to $Sp_N$ and N flip-flops $Dp_1$ to $Dp_N$ are alternately connected in cascade and a flip-flop $Dp_0$ is connected at a preceding stage of the first stage selector $Sp_1$, and a serial shift register in which N selectors $Sm_1$ to $Sm_N$ and N flip-flops $Dm_1$ to $Dm_N$ are alternately connected in cascade.

Reference letter N represents a processing unit length (bit number) used for subjecting the reproduced data (the even string sample) to the Viterbi decoding.

A value 0 is input as a signal B or D to the first stage selector $Sp_1$ or $Sm_1$, and a survivor path pattern signal (merge) supplied from the comparing circuit 13 is input as a signal A or C thereto through the flip-flop $Dp_0$. Either of the signals (either of the signals A and B or either of the signals C or D) is selected in correspondence with the survivor path pattern signal (merge) and the data (data) supplied from the comparing circuit 13 and then output to the flip-flop $Dp_1$ or $Dm_1$.

The survivor path pattern signal (merge) is a flag indicating whether or not a result of discrimination of input condition is the parallel path, in other words, whether or not the state can be changed. The data (data) is also a flag indicating whether or not the state has already been changed. For example, merge=1 and data=0 indicate that the state could be changed ( 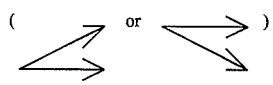 )

but the state has not actively been changed actually.

As shown in Tables 1 and 2, the comparing circuit 13 sets merge=1 when the upward divergence or the downward divergence occurs; and the comparing circuit 13 sets merge=0 when the parallel path occurs.

Data latched by the preceding stage flip-flop $DP_{n-1}$ are input as the signal A or C to the selectors $Sp_n$ or $Sm_n$ (n=2, ..., N) excluding the first stage selector $Sp_1$ or $Sm_1$, and data latched by the preceding stage flip-flop $Dm_{n-1}$ are input as the signal B or D thereto. Either of the signals A and B or either of the signals C and D is selected in correspondence with the survivor path pattern signal (merge) and the data (data) supplied from the comparing circuit 13 and then output to the succeeding stage flip-flop $Dp_{n+1}$ or $Dm_{n+1}$, respectively.

TABLE 3

| | output of selector $Sp_n$ | output of selector $Sm_n$ |
|---|---|---|
| merge = 0 | A | D |
| merge = 1 and data = 1 | A | C |
| merge = 1 and data = 0 | B | D |

As shown in Table 3, the selector $Sp_n$ ($Sm_n$) selects and outputs either of the input signals A and B (C and D) in response to the survivor path pattern signal (merge) and the data (data) supplied from the comparing circuit 13.

The flip-flop $Dp_n$ or $Dm_n$ latches an output supplied from the preceding stage selector $Sp_n$ or $Sm_n$ in synchronism with a PLL clock output from a PLL (not shown).

If the arrangement as shown in FIG. 12 is employed, then a squaring circuit becomes unnecessary and it is sufficient to merely provide one adder and two comparators.

Subsequently, an operation carried out by the circuit shown in FIG. 12 when a certain signal is input thereto (now explained with reference to FIGS. 14 and 15 which are timing charts).

When a signal as shown in FIG. 14 is input to the decoder 116 shown in FIG. 12, the comparing circuit 13 and the shift register 121 (shown in FIG. 13) are respectively operated in accordance with Tables 1 and 2 and Table 3 as follows. Initial values of the values $y_p$ and $\beta$, however, are set as $y_p=-2$ and $\beta=-1$, respectively. <in case of k=0: input $y_k=y_0=1.6$; $y_p=-2$; $\beta=-1$>

Since $y_k-y_p=1.6-(-2)=3.6>2$ is established, an input to the decoder corresponds to the condition pattern F in Table 2. That is, since the upward divergence (sometimes referred to as divergence) occurs, in accordance with Table 2, the value $\beta$ stored in the register 12a is updated with +1 and the value $y_p$ (the sample value at a time when one previous divergence occurred) stored in the register 12b is updated as $y_p=y_0=1.6$.

At the same time, in accordance with Table 2, the comparing circuit 13 outputs the survivor path pattern signal (merge=1) and the data (data=1) to the shift register 121.

Accordingly, in the shift register 121 (shown in FIG. 12), the flip-flop $Dp_0$ latches the signal of merge=1 (shown in FIG. 15).

<in case of k=1: input $y_k=y_1=0.2$; $y_p=1.6$; $\beta=+1$; p=0>

Since $-2 \leq y_k-y_p=0.2-1.6=-1.4 \leq 0$ is established, the input corresponds to the condition pattern B shown in Table 1. That is, since the parallel path occurs, the values $\beta$ and y respectively stored in the registers 12a and 12b are set as they are ($\beta=1$ and $y_p=y_0$). The comparing circuit 13 outputs the survivor path pattern signal (merge=0) and the data (data=0) to the shift register 121.

In the shift register 121, the flip-flop $Dp_0$ latches the signal of merge=0. Further, since merge=0 is established, in accordance with Table 3, the signal A of the signal A and B and the signal D of the signals C and D are respectively selected and then output by the selectors $Sp_n$ and $Sm_n$ to the succeeding stage flip-flops $Dp_n$ and $Dm_n$ which latch the signals A and D, respectively.

In case of the parallel path pattern, a signal (bit) latched by the flip-flop $Dp_n$ at an upper stage is latched by the succeeding stage flip-flop $DP_{n+1}$ at the same upper stage, and a signal (bit) latched by the flip-flop $Dm_n$ at a lower stage is latched by the succeeding stage flip-flop $Dm_{n+1}$ at the same lower stage. In this case, however, the flip-flop $Dm_1$ at the lower stage latches a value 0 which is always input to the selector $Sm_1$ as the signal D.

Accordingly, in case of k=1, the upper stage flip-flops $Dp_0$ and $Dp_1$ latch values 0 and 1, respectively, and the lower stage flip-flop $Dm_1$ latches a value 0 (shown in FIG. 15).

<in case of k=2: input $y_k=y_2=-0.2$; $y_p=1.6$; β=+1; p=0>

Since $-2 \leq y_k-y_p=-0.2-1.6=-1.8 \leq 0$ is established, the input corresponds to the condition pattern B shown in Table 1. That is, since the parallel path occurs, the values β and y respectively stored in the registers 12a and 12b are set as they are. The comparing circuit 13 outputs the survivor path pattern signal (merge=0) and the data (data=0) to the shift register 121.

In the shift register 121, the flip-flop $Dp_0$ latches the signal of merge=0. Since merge=0 is established, in accordance with Table 3, the signal (bit) latched by the flip-flop $Dp_n$ at the upper stage is latched by the succeeding stage flip-flop $Dp_{n+1}$ at the same upper stage, and the signal (bit) latched by the flip-flop $Dm_n$ at the lower stage is latched by the succeeding stage flip-flop $Dm_{n+1}$ at the same lower stage.

Accordingly, in case of k=2, the upper stage flip-flops $Dp_0$, $Dp_1$ and $Dp_2$ latch values 0, 1 and 1, respectively, and the lower stage flip-flops $Dm_1$ and $Dm_2$ latch values 0 and 0, respectively (FIG. 15).

<in case of k=3: input $y_k=y_3=2.0$; $y_p=1.6$; β=+1; p=0>

Since $y_k-y_p=2.0-1.6=0.4>0$ is established, the input corresponds to the condition pattern C shown in Table 1. That is, since the upward divergence occurs, the previous candidate value $y_p$ was defeated by the present value $y_k$ ($y_p<y_k$ was established). In other words, although it was determined that the upward divergence (β=+1) occurred in case of k=0 (p=0), the upward divergence (β=+1) occurred at this time (in case of k=3), so that the parallel path of the upward divergence was selected at the previous time (the path would become discontinuous at k=3 if the upward shift had been selected at k=0).

Then, in accordance with Table 1, the vale β stored in the register 12a is set to +1 and the value $y_p$ stored in the register 12b is set as $y_p=y_3=2.0$. Further, the comparing circuit 13 outputs the survivor path pattern signal (merge=1) and the data (data=0) to the shift register 121.

In the shift register 121, the flip-flop $Dp_0$ latches the signal of merge=1. Further, since merge=1 and data=0 are established, in accordance with Table 3, the selector $Sp_n$ or $Sm_n$ respectively selects the signal B or the signal D of the signals A and B or the signals C and D, which is respectively output therefrom to and then latched by the succeeding stage flip-flop $Dp_n$ or $Dm_n$.

If the just previous divergence was the upward divergence (β=+1 was established) and further the present divergence is the upward divergence, then it is determined that the signal (bit) latched by the upper stage flip-flop $Dp_n$ as a decoding data candidate is defeated and hence the signal (bit) latched by the lower stage flip-flop $Dm_n$ is latched by the succeeding stage flip-flops $DP_{n+1}$ and $Dm_{n+1}$ at the upper and lower stages. In this case, however, the upper stage flip-flop $Dp_1$ latches the value 0 which is always input to the selector $Sp_1$ as the signal B.

Accordingly, in case of k=3, the upper stage flip-flops $Dp_0$, $Dp_1$, $Dp_2$ and $Dp_3$ latch the values 1, 0, 0 and 0, respectively, and the lower stage flip-flops $Dm_1$, $Dm_2$ and $Dm_3$ latch the values 0, 0 and 0, respectively (as shown in FIG. 15).

<in case of k=4: input $y_k=y_4=0.2$; $y_p=2.0$; β=+1; p=3>

Since $-2 \leq y_k-y_p=0.2-2.0=-1.8 \leq 0$ is established, the input corresponds to the condition pattern B shown in Table 1. That is, since the parallel path occurs, the values β and $y_p$ respectively stored in the registers 12a and 12b are set as they are. The comparing circuit 13 outputs the survivor path pattern signal (merge=0) and the data (data=0) to the shift register 121.

In the shift register 121, the flip-flop $Dp_0$ latches the signal of merge=0. Since merge=0 is established, the signal (bit) latched by the flip-flop $Dp_n$ at the upper stage is latched by the succeeding stage flip-flop $DP_{n+1}$ at the same upper stage, and the signal (bit) latched by the flip-flop $Dm_n$ at the lower stage is latched by the succeeding stage flip-flop $Dm_{n+1}$ at the same lower stage.

<in case of k=5: input $y_k=y_5=-0.4$; $y_p=2.0$; β=+1; p=3>

Since $y_k-y_p=-0.4-2.0=-2.4<-2$ is established, the input corresponds to the condition pattern A shown in Table 1. That is, since the downward divergence occurs, it is determined that the previous candidate value is correct (that is, in case of k=3 (p=3), the upward shift of the upward divergence was selected.).

Therefore, in accordance with Table 1, the value β stored in the register 12a is set to −1 and the value $y_p$ stored in the register 12b is set as $y_p=y_5=-0.4$. Further, the comparing circuit 13 outputs the survivor path pattern signal (merge=1) and the data (data=1) to the shift register 121.

In the shift register 121, since the flip-flop $Dp_0$ latches the signal of merge=1 and further merge=1 and data=1 are established, in accordance with Table 3, the selectors $Sp_n$ and $Sm_n$ respectively select the signal A of the signals A and B and the signal C of the signals C and D, which are respectively output therefrom to and then latched by the succeeding stage flip-flops $Dp_n$ and $Dm_n$.

When the previous divergence was the upward divergence (β=+1 was established) and further the present divergence is the downward divergence, it is determined that the signal (bit) latched by the upper stage flip-flop $Dp_n$ as the decoding data candidate is correct and hence the signal (bit) latched by the upper stage flip-flop $Dp_n$ is latched by the succeeding stage flip-flops $DP_{n+1}$ and $Dm_{n+1}$ at the upper stage and lower stage.

<in case of k=6: input $y_k=y_6=-0.2$; $y_p=-0.4$; β=−1; p=5>

Since $0 \leq y_k-y_p=-0.2-(-0.4)=0.2 \leq +2$ is established, the input corresponds to the condition pattern E shown in Table 2. That is, since the parallel path occurs, the values β and $y_p$ are set as they are. The comparing circuit 13 outputs the survivor path pattern signal (merge=0) and the data (data=0) to the shift register 121.

In the shift register 121, the flip-flop $Dp_0$ latches the signal of merge=0. Since merge=0 is established, the signal (bit) latched by the flip-flop $Dp_n$ at the upper stage is latched by the succeeding stage flip-flop $DP_{n+1}$ at the same upper stage, and the signal (bit) latched by the flip-flop $Dm_n$ at the lower stage is latched by the succeeding stage flip-flop $Dm_{n+1}$ at the same lower stage.

<in case of k=7: input $y_k=y_7=-2.0$; $y_p=-0.4$; β=−1; p=5>

Since $y_k-y_p=-2.0-(-0.4)=-1.6<0$ is established, the input corresponds to the condition pattern D shown in Table 2. That is, since the downward divergence occurs, it is determined that the previous candidate value was defeated. That is, in case of k=5 (p=5), not the downward shift but the parallel shift was selected.

Therefore, in accordance with Table 2, the value β stored in the register 12a is set to −1 and the value $y_p$ stored in the register 12b is set as $y_p = y_7 = -2.0$. Further, the comparing circuit 13 outputs the survivor path pattern signal (merge=1) and the data (data=0) to the shift register 121.

In the shift register 121, since the flip-flop $Dp_0$ latches the signal of merge=1 and further merge=1 and data=0 are established, in accordance with Table 3, the selectors $Sp_n$ and $Sm_n$ respectively select the signal B of the signals A and B and the signal D of the signals C and D, which are respectively output therefrom to and then latched by the succeeding stage flip-flops $Dp_n$ and $Dm_n$.

If the just previous divergence was the downward divergence (β=−1 was established) and further the present divergence is the downward divergence, then it is determined that the signal (bit) latched by the upper stage flip-flop $Dp_n$ as the decoding data candidate was defeated and hence the signal (bit) latched by the lower stage flip-flop $Dm_n$ is latched by the succeeding stage flip-flops $DP_{n+1}$ and $Dm_{n+1}$ at the upper and lower stages. In this case, however, the upper stage flip-flop $Dp_1$ latches the value 0 which is always input to the selector $Sp_1$ as the signal B.

<in case of k=8: input $y_k = y_8 = 0.2$; $y_p = -2.0$; β=−1; p=7>

Since $y_k - y_p = 0.2 - (-2.0) = 2.2 > +2$ is established, the input corresponds to the condition pattern F shown in Table 2. That is, since the upward divergence occurs, it is determined that the previous data is correct. In other words, in case of k=7 (p=7), the downward shift occurred.

Therefore, in accordance with Table 2, the value β stored in the register 12a is set to 1 and the value $y_p$ stored in the register 12b is set as $y_p = y_8 = 0.2$. Further, the comparing circuit 13 outputs the survivor path pattern signal (merge=1) and the data (data=1) to the shift register 121.

In the shift register 121, the flip-flop $Dp_0$ latches the signal of merge=1. Further, since merge=1 and data=1 are established, in accordance with Table 3, the selector $Sp_n$ or $Sm_n$ respectively selects the signal A or the signal C of the signals A and B or the signals C and D, which is respectively output therefrom to and then latched by the succeeding stage flip-flop $Dp_n$ or $Dm_n$.

When the previous divergence was the downward divergence (β=−1 was established) and further the present divergence is the upward divergence, it is determined that the signal (bit) latched by the upper stage flip-flop $Dp_n$ as the decoding data candidate is correct and hence the signal (bit) latched by the upper stage flip-flop $Dp_n$ is latched by the succeeding stage flip-flops $DP_{n+1}$ and $Dm_{n+1}$ at the upper stage and lower stage.

Hereinafter, the data are decoded similarly. A bit for causing the condition A or C shown in Table 1 or the condition D or F shown in Table 2 is added to the end of a bit string. If the condition A or C shown in Table 1 or the condition D or F shown in Table 2 is caused, then the values stored by the upper stage flip-flops $Dp_1$ to $Dp_N$ and the lower stage flip-flops $Dm_1$ to $Dm_N$ are respectively matched with each other. Therefore, either of the data (bit) latched by the upper stage flip-flop $Dp_N$ and the lower flip-flop $Dm_N$ (for example, by the upper stage flip-flop $Dp_N$) are successively received to thereby obtain the Viterbi-decoded data.

A magnetic recording and reproducing apparatus or an optical recording and reproducing apparatus, for example, adds an error detecting code such as a CRC (Cyclic Redundancy Check) code, for example, or the like to an ID such as a sector number, a track number or the like in order to improve reliability.

If an equation $$G(x) = x^{16} + x^{12} + x^5 + 1 \qquad (6)$$

is used as a generating polynomial G(x) of the CRC code, for example, then data of a predetermined bit length BL are divided by the generating polynomial $G(x) = x^{16} + x^{12} + x^5 + 1$ and a remainder of the division is added to an end of the data.

When an error of the data added with such CRC code is detected, a CRC decoding circuit as shown in FIG. 16 is used.

In the CRC decoding circuit, there are connected in series flip-flops $D_1$ to $D_{16}$ of the same number as the highest degree of the generating polynomial (which is 16 in case of the generating polynomial shown in equation (6)) and there are provided XOR gates (which are indicated by a symbol composed by inserting a symbol + into a symbol ○ in the figure) at the preceding stage of the flip-flop $D_1$, between the flip-flops $D_5$ and $D_6$ and between the flip-flops $D_{12}$ and $D_{13}$.

Further, to the XOR gate provided at the preceding stage of the flip-flop $D_1$, the decoded data are input and further an output from the flip-flop $D_{16}$ is fed back. An output of the above XOR gate is input to not only the flip-flop $D_1$ but also the XOR gates provided between the flip-flops $D_5$ and $D_6$ and between the flip-flops $D_{12}$ and $D_{13}$.

In the CRC decoding circuit thus arranged, an exclusive-OR of a decoded bit string of the predetermined bit length (the bit length of data including the CRC code) BL and the output from the flip-flop $D_{16}$ is calculated at the XOR gate provided at the preceding stage of the flip-flop $D_1$. While the exclusive-OR of the decoded bit string and the output of the XOR gate provided at the preceding stage of the flip-flop $D_1$ is being calculated at the XOR gates provided between the flip-flops $D_5$ and $D_6$ and between the flip-flops $D_{12}$ and $D_{13}$, the decoded bit string is successively latched by the flip-flops $D_1$ to $D_{16}$, whereby when the last bit of the bit string is input to the flip-flop $D_1$, the bit string is subjected to a calculation (CRC calculation) in which the bit string is divided by the generating polynomial shown in equation (6).

As a result, if the bits latched by the flip-flops $D_1$ to $D_{16}$ all have values 0, i.e., the decoded bit string of the predetermined bit length BL is completely divided by the generating polynomial shown in equation (6), then it is determined that the bit string has no error. If any one of the bits latched by the flip-flops $D_1$ to $D_{16}$ is not a value 0, i.e., the decoded bit string of the predetermined bit length BL is not completely divided by the generating polynomial shown in equation (6), then it is determined that the bit string has an error.

When the data are decoded by the Viterbi decoder 116 arranged as shown in FIG. 12, it is necessary that the data (bit) are successively shifted by the shift register 21 shown in FIG. 13. Therefore, a processing time is delayed to an extent of the bit number of the number of the flip-flop $Dp_n$ ($Dm_n$) provided in series in the shift register 121.

When the error of the decoded data is detected by the CRC decoding circuit as shown in FIG. 16, it is necessary that the flip-flops $D_1$ to $D_{16}$ successively latch the bit strings of the predetermined bit length BL. Therefore, a processing time is delayed to an extent of the predetermined bit length BL.

Accordingly, when the error of the data decoded by the Viterbi decoder 116 is detected by the CRC decoding circuit as shown in FIG. 16, the processing time is considerably delayed.

The Viterbi decoder 116 and the CRC decoding circuit are not useful for a portion where there is required quick judgement whether or not data are read from or written on a sector after an ID is decoded, such as an ID portion of the sector or the like. However, if they are applied to such portion in order to improve reliability of the apparatus, then, as shown in the timing diagram of FIG. 17, a long gap must be provided between an end of an ID region of the recording medium corresponding to a timing when the input of the reproduced data of the ID to the Viterbi decoder 116 is terminated and a beginning of a data region corresponding to a timing when a CRC operation in the CRC decoding circuit is terminated (input of the decoded data of the ID from the Viterbi decoder 116 to the CRC decoding circuit is terminated). Therefore, there is then the problem that a recording capacity of the recording medium is lowered.

DISCLOSURE OF THE INVENTION

The present invention is made in view of this situation and thus minimizes a delay time cased by the maximum likelihood decoding and CRC operations such that the capacity of the recording medium can be enlarged.

An information reproducing apparatus according to the present invention reproduces data from a recording medium by utilizing a partial response system and decodes the data by using a shift register on the basis of a Viterbi decoding method, being characterized in that the shift register includes flip-flops $Da_j$ as a plurality of latch means connected to each other in series for latching the data and XOR gates 31a to 31d as arithmetic means which are disposed between the adjacent flip-flops $Da_j$ to carry out CRC calculation and calculates exclusive-ORs of outputs of the flip-flops $Da_j$.

According to the information reproducing apparatus, if a highest degree of a generating polynomial in the CRC calculation is set to j, then the shift register includes the flip-flops $Da_j$ of at least j+2 stages and a result of the CRC calculation can be estimated on the basis of values latched by the latter j stage flip-flops $Da_j$ of the flip-flops $Da_j$ of at least j+2 stages.

Further, according to the information reproducing apparatus, the data are recorded on the recording medium by using a partial response class IV, and the data can be decoded and the CRC calculation can be performed by using and interleaving a pair of processing means for performing processing with a partial response (1, −1).

According to the information reproducing apparatus arranged as described above, the XOR gates 31a to 31d for calculating the exclusive-ORs of the outputs of the flip-flops $Da_j$ are disposed between the adjacent flip-flops $Da_j$ connected in series to each other for forming the shift register for effecting a Viterbi decoding method to carry out the CRC calculation. Accordingly, since the Viterbi decoding and the CRC operation are carried out simultaneously, a delay time necessarily caused by the data decoding and the error correction can be drastically reduced, with the result that the recording capacity of the recording medium can be improved.

BRIEF DESCRIPTION OF DRAWINGS

FIGS. 3A–3D represent diagrams showing concrete arrangement of signal generating circuits (30a to 30d).

FIGS. 4A–4D represent timing charts used to explain operation of the embodiment shown in FIG. 1.

FIG. 11 is a diagram used to explain a Viterbi algorithm.

BEST MODE CARRYING OUT THE INVENTION

Figure 1:
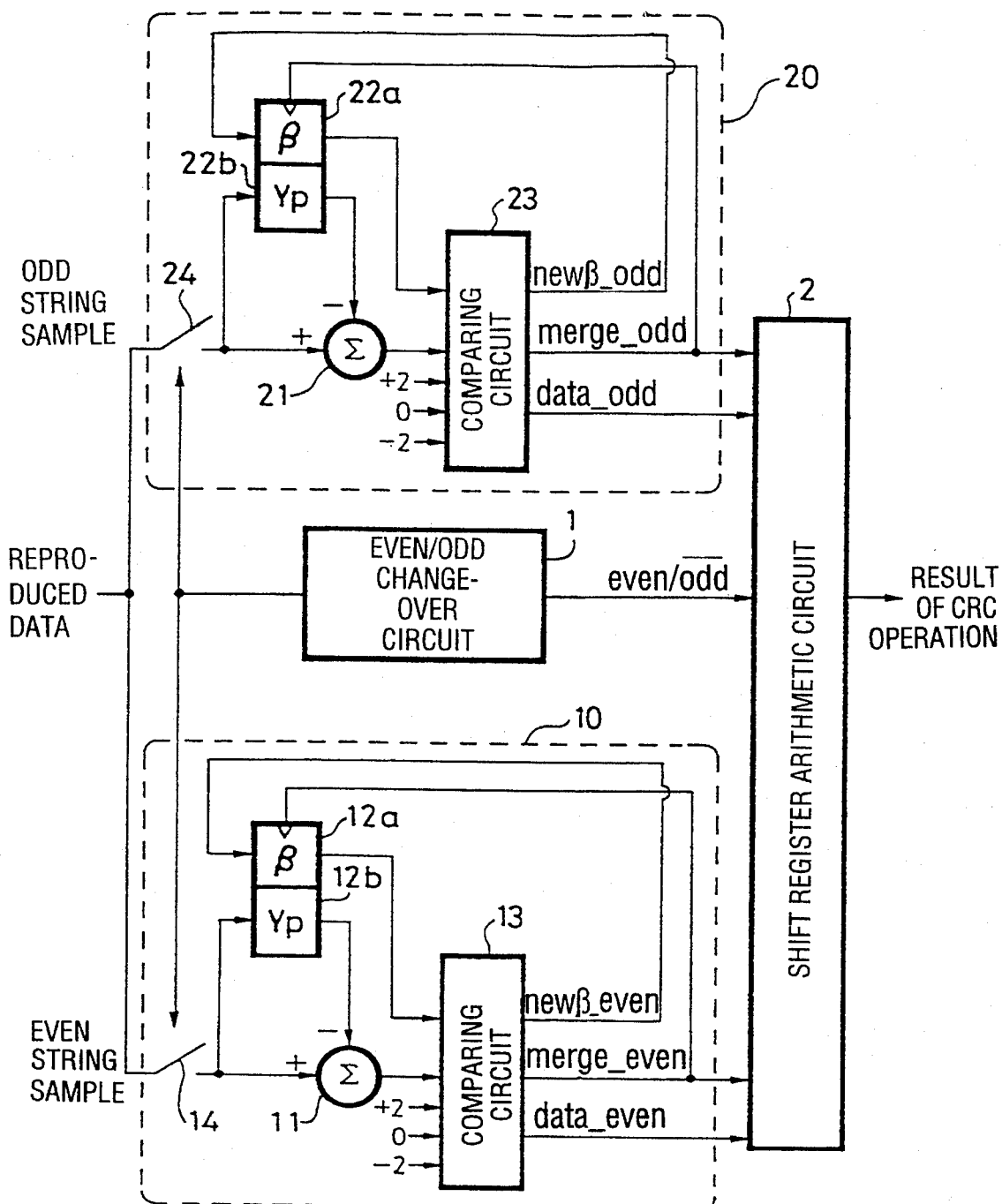
FIG. 1 is a block diagram showing construction of an information reproducing apparatus according to one embodiment of the present invention.

FIG. 1 is a block diagram showing construction of the information reproducing apparatus according to one embodiment of the present invention. In the figure, the same reference numerals are given to portions corresponding those shown in FIG. 12. In the apparatus, a processing circuit 10 for processing an even string sample has an arrangement in which the shift register 121 is removed from a processing circuit 120 shown in FIG. 12, and a shift register arithmetic circuit 2 is provided instead of the synthesizing circuit 141.

A processing circuit 20 for processing an odd string sample is formed of a subtracting circuit 21, registers 22a and 22b, a comparing circuit 23 and a switch 24 which are respectively formed similarly to a subtracting circuit 11, registers 12a and 12b, a comparing circuit 13 and a switch 14 of the processing circuit 10.

Further, as shown in FIG. 1, a value β, a signal merge and data data output from the comparing circuit 13 of the processing circuit 10 for processing the even string sample are added at their ends of letters with reference letters _even in order to indicate that they are signals corresponding to the even string sample. A value β, a signal merge and data data output from the comparing circuit 23 of the processing circuit 20 for processing the odd string sample are added at their ends of letters with reference letters _odd in order to indicate that they are signals corresponding to the odd string sample.

Figure 2:
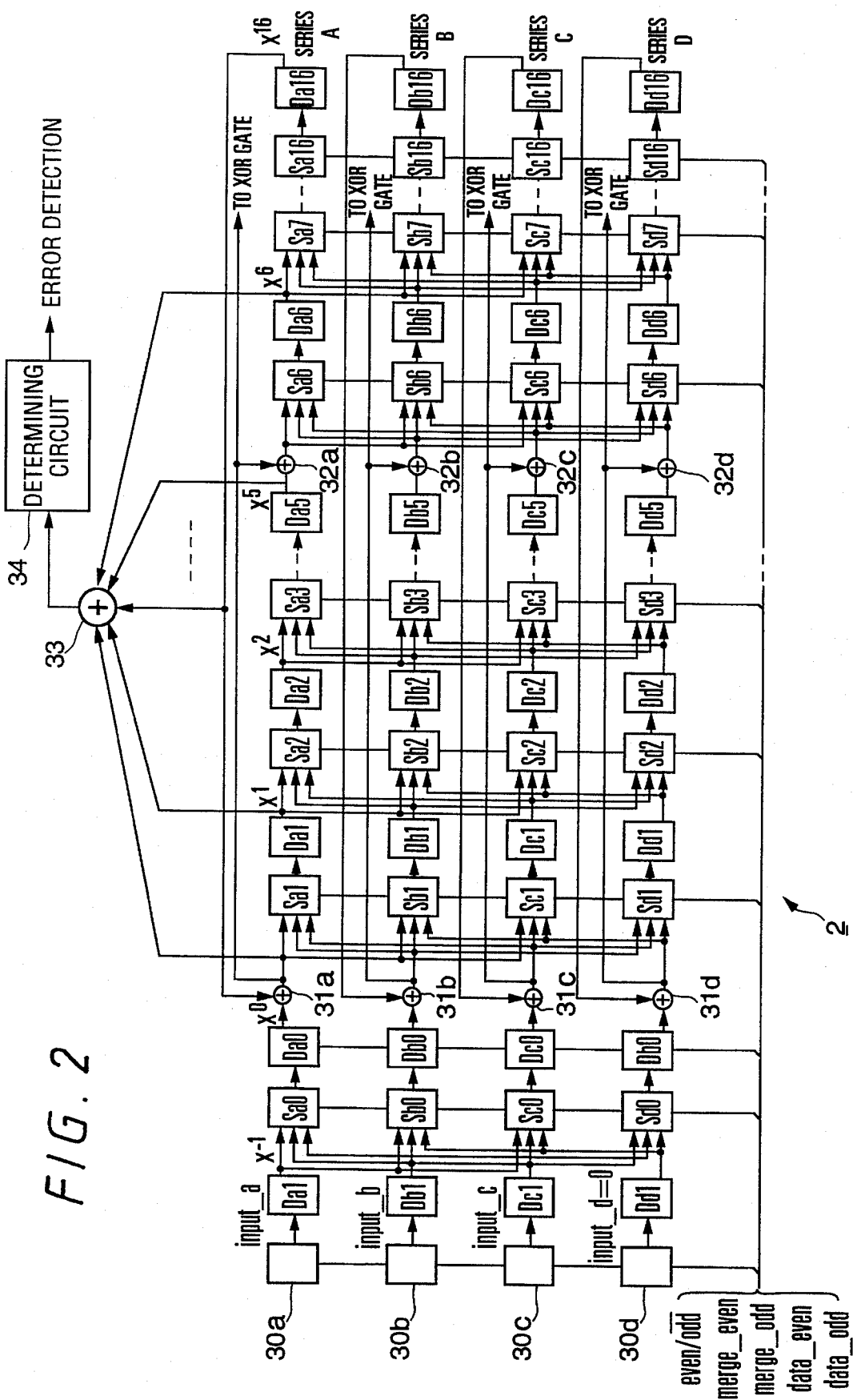
FIG. 2 is a block diagram showing in detail a shift register arithmetic circuit 2 shown in FIG. 1.

The shift register arithmetic circuit 2 is arranged as shown in FIG. 2 and subjects reproduced data to a Viterbi decoding on the basis of an algorithm using the above-mentioned differential metric and to a CRC operation simultaneously.

If the highest degree of a generating polynomial in the CRC operation is set to j, then the shift register arithmetic circuit 2, as shown in FIG. 2, is formed as a parallel load/serial shift register in which there are connected in parallel serial shift registers of four series a to d respectively arranged such that j+1 selectors $Sa_0$ to $Sa_j$, $Sb_0$ to $Sb_j$, $Sc_0$ to $Sc_j$ and $Sd_0$ to $Sd_j$ are connected between j+2 flip-flops $Da_{-1}$ to $Da_j$, $Db_{-1}$ to $Db_j$, $Dc_{-1}$ to $Dc_j$ and $Dd_{-1}$ to $Dd_j$ connected in series.

The flip-flops $Da_{-1}$ to $Da_j$, $Db_{-1}$ to $Db_j$, $Dc_{-1}$ to $Dc_j$ and $Dd_{-1}$ to $Dd_j$ latch input data at a timing in which a clock (shown in FIG. 4(a)) is supplied. The selectors $Sa_0$ to $Sa_j$, $Sb0$ to $Sb_j$, $Sc_0$ to $Sc_j$ and $Sd_0$ to $Sd_j$ select and output one of three input signals respectively input on the basis of a change-over signal supplied from a change-over circuit 1 (even/odd$^{-1}$ (which is represented in FIGS. 1 to 4 by adding a bar (−) to a portion above odd), merge_even and data_even supplied from the comparing circuit 10 and merge_odd and data_odd supplied from the comparing circuit 20.

In this embodiment, the generating polynomial in the CRC operation is expressed by G(x) shown in the above equation (6). Accordingly, the value j is set to 16.

Further, the shift register arithmetic circuit 2 is arranged such that XOR gates 31a to 31d are respectively provided between the flip-flops $Da_0$, $Db_0$, $Dc_0$ and $Dd_0$ and the selectors $Sa_1$, $Sb_1$, $Sc_1$ and $Sd_1$, XOR gates 32a to 32d are respectively provided between the flip-flops $Da_5$, $Db_5$, $Dc_5$ and $Dd_5$ and the selectors $Sa_6$, $Sb_6$, $Sc_6$ and $Sd_6$, XOR gates (not shown) are respectively provided between the flip-flops $Da_{12}$, $Db_{12}$, $Dc_{12}$ and $Dd_{12}$ and the selectors $Sa_{13}$, $Sb_{13}$, $Sc_{13}$ and $Sd_{13}$, and outputs of the flip-flops $Da_{16}$, $Db_{16}$, $Dc_{16}$ and $Dd_{16}$ are respectively input (fed back) to the XOR gates 31a to 31d.

The shift register arithmetic circuit 2 is also arranged such that outputs of the XOR gates 31a to 31d are respectively input to the XOR gates 32a to 32d and to the XOR gates provided between the flip-flops $Da_{12}$, $Db_{12}$, $Dc_{12}$ and $Dd_{12}$ and the selectors $Sa_{13}$, $Sb_{13}$, $Sc_{13}$ and $Sd_{13}$.

Figure 16:
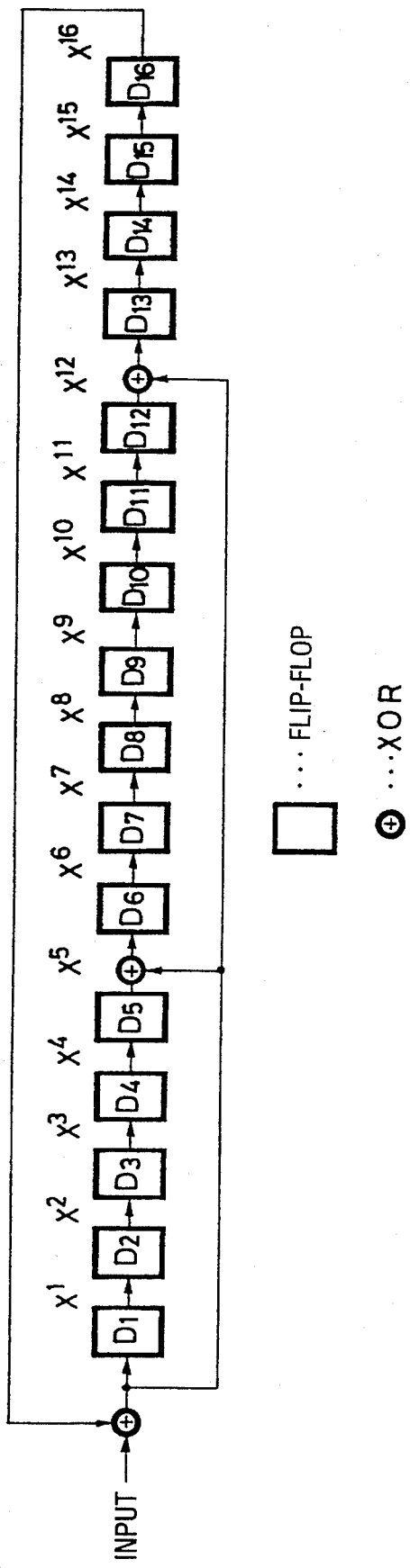
FIG. 16 is a block diagram showing construction of one example of a CRC decoding circuit for carrying out a CRC operation.
Figure 17:
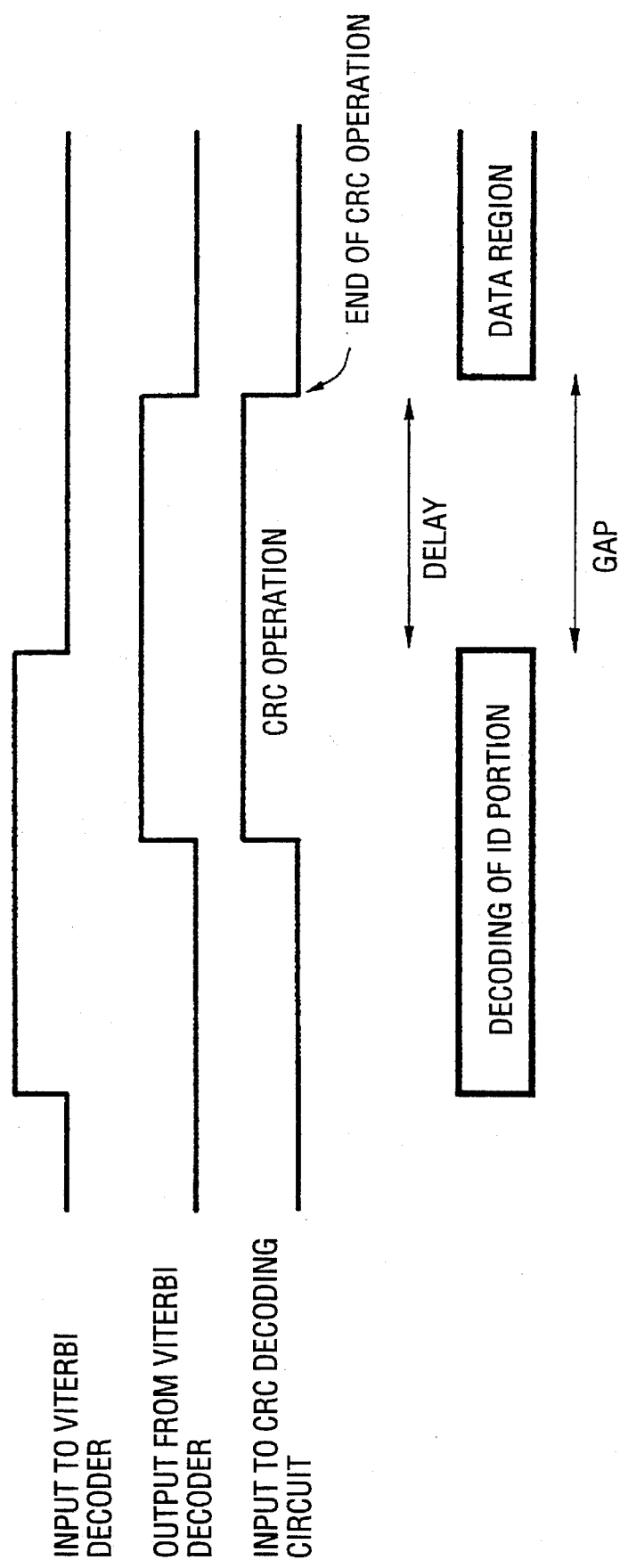
FIG. 17 is a timing chart used to explain timings of the Viterbi decoding and the CRC operation in a conventional apparatus.

Accordingly, each of the serial shift registers of the four series a to d in the shift register arithmetic circuit 2 is arranged similarly to one provided with the selectors at the preceding stages of the respective flip-flops of the CRC decoding circuit corresponding to the generating polynomial of equation (6) of FIG. 16 and with two flip-flops and one selector at the preceding stage of the XOR gate provided at the preceding stage of the flip-flop $D_1$.

In other words, if attention is given to each of the serial shift registers of the four series a to d of the shift register arithmetic circuit 2, then each of the serial shift registers carries out the CRC operation based on the generating polynomial G(x) shown in equation (6).

Figure 13:
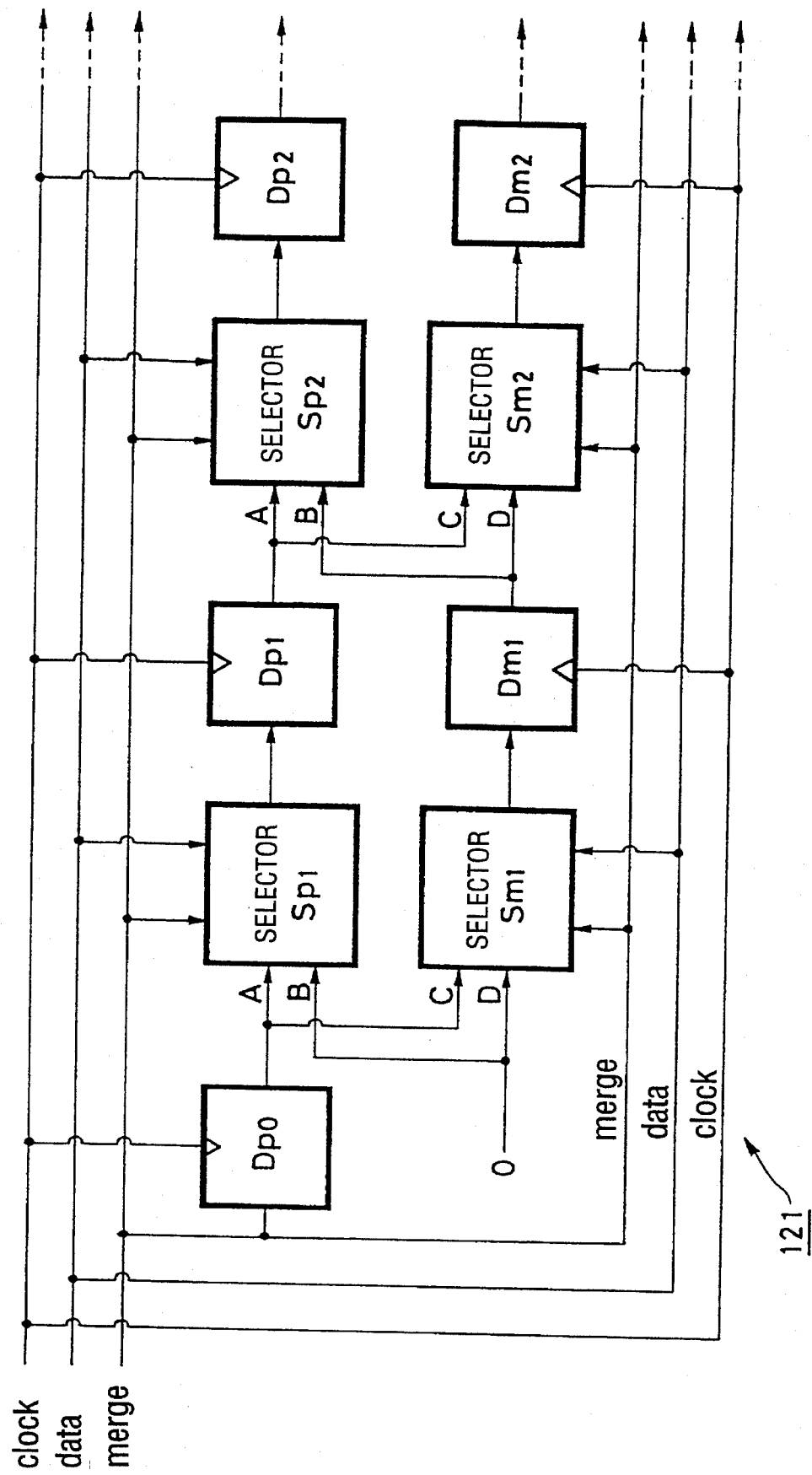
FIG. 13 is a block diagram showing in detail a shift register 121 of the decoder 116 shown in FIG. 12.
Figure 14:
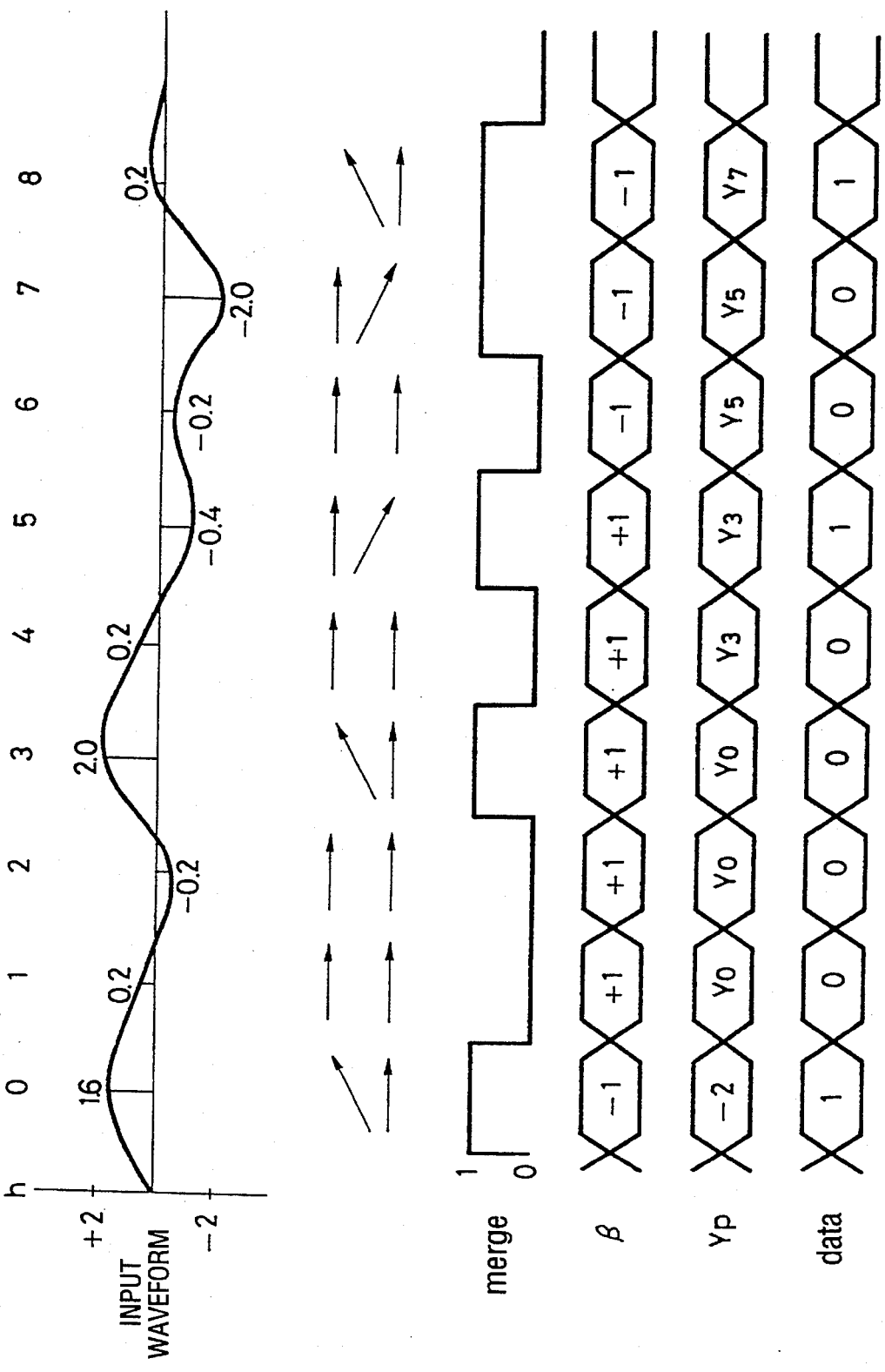
FIG. 14 is a timing chart used to explain operation of the decoder 116 shown in FIG. 12.
Figure 15:
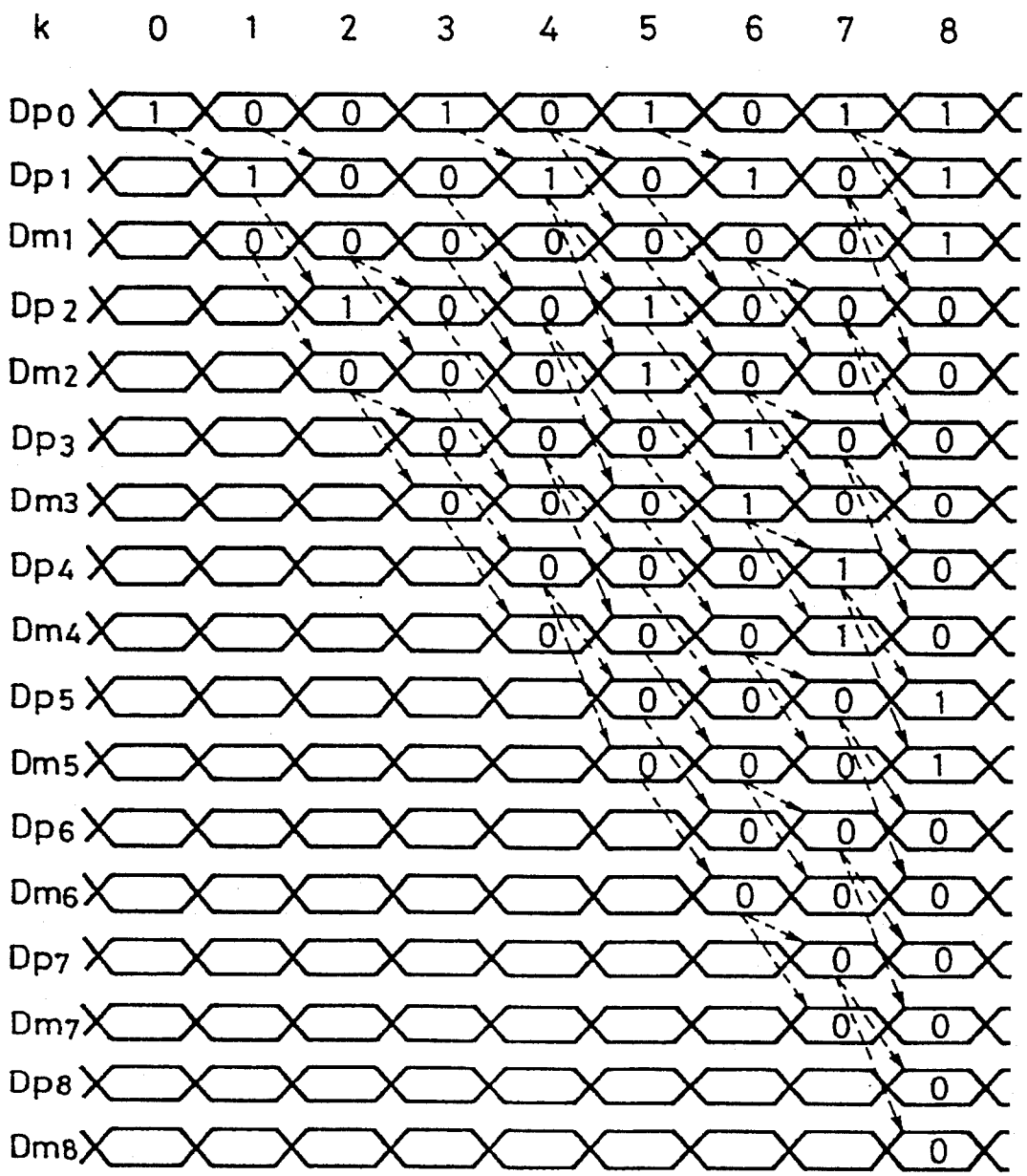
FIG. 15 is a timing chart used to explain operation of the shift register 121 shown in FIG. 13.

If a circuit in which all the XOR gates are removed from the shift register arithmetic circuit 2 is supposed, then the circuit is one which is developed from the shift register 121 shown in FIG. 13 for processing the even string sample and simultaneously processes the even string sample and the odd string sample.

In other words, the circuit which is formed by removing all the XOR gates from the shift register arithmetic circuit 2, Viterbi-decodes reproduced data successively (in order of samples) and outputs them.

Figure 6:
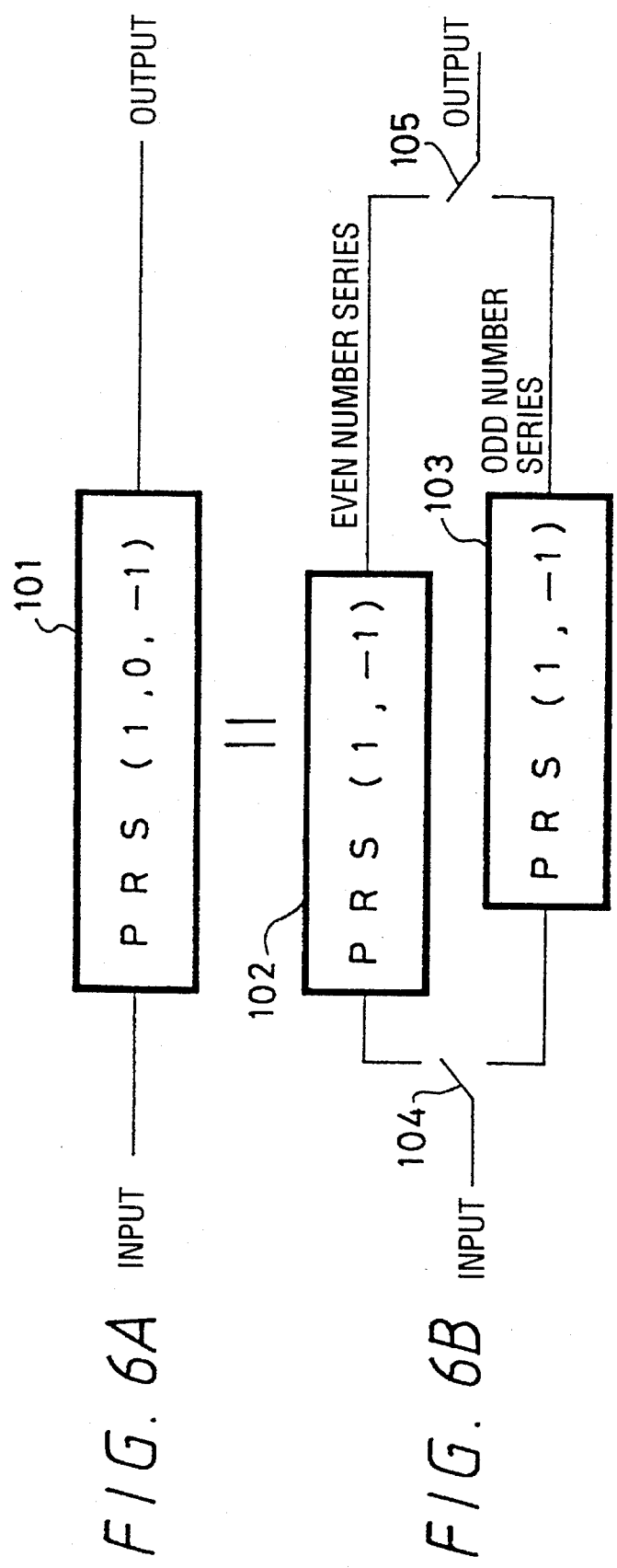
FIGS. 6A and 6B represent block diagrams used to explain a partial response modulation.
Figure 7:
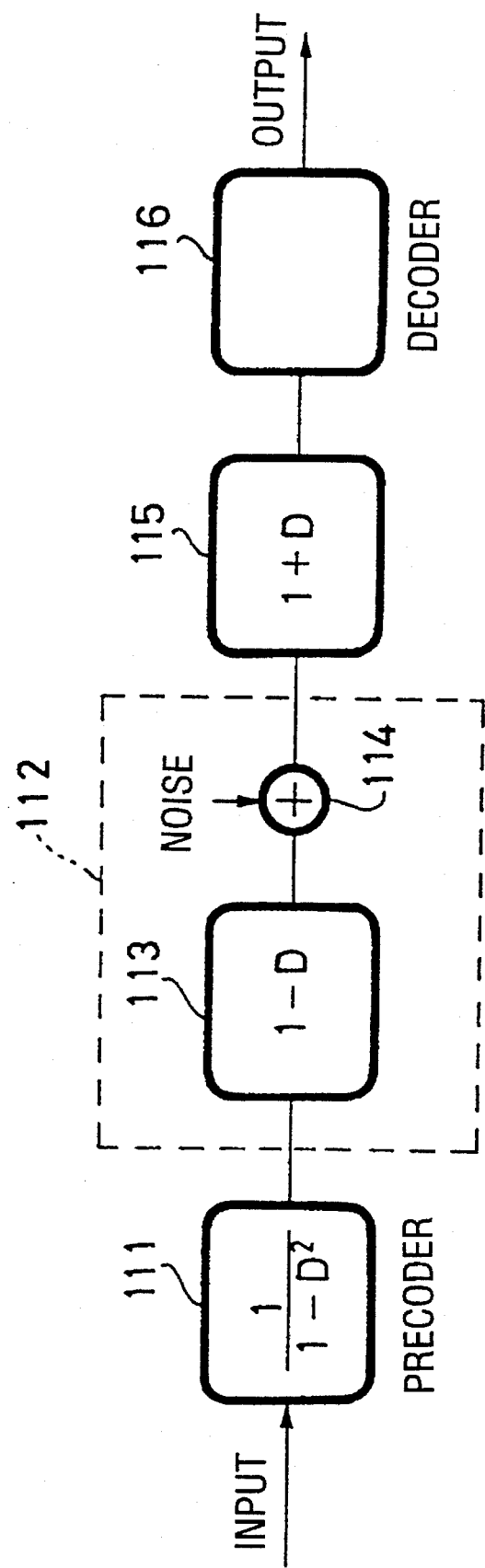
FIG. 7 is a block diagram showing construction of a recording and reproducing system of the partial response.
Figure 8:
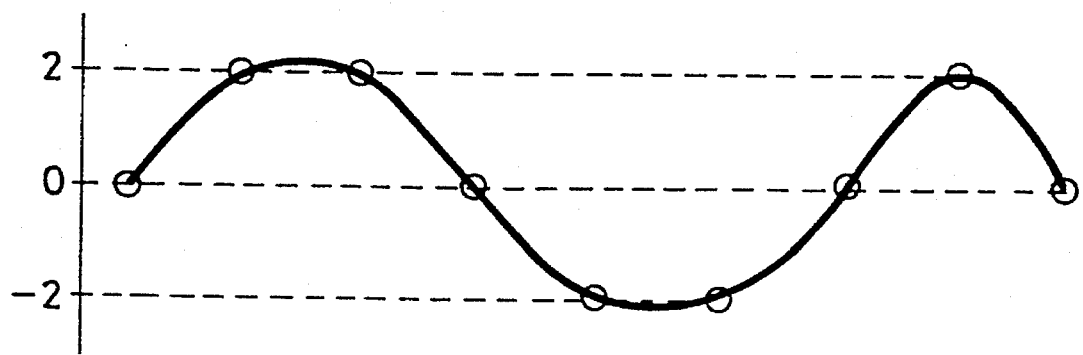
FIG. 8 is a graph showing change of a signal level.
Figure 9:
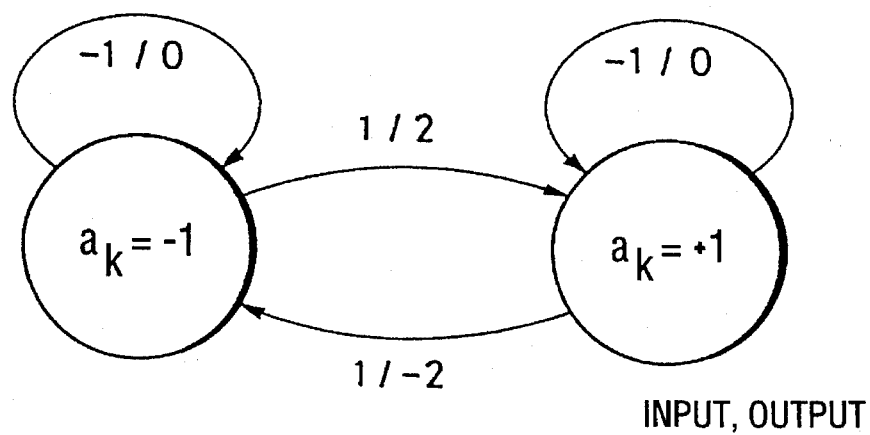
FIG. 9 a state transition diagram of a partial response PRS (1, −1).
Figure 10:
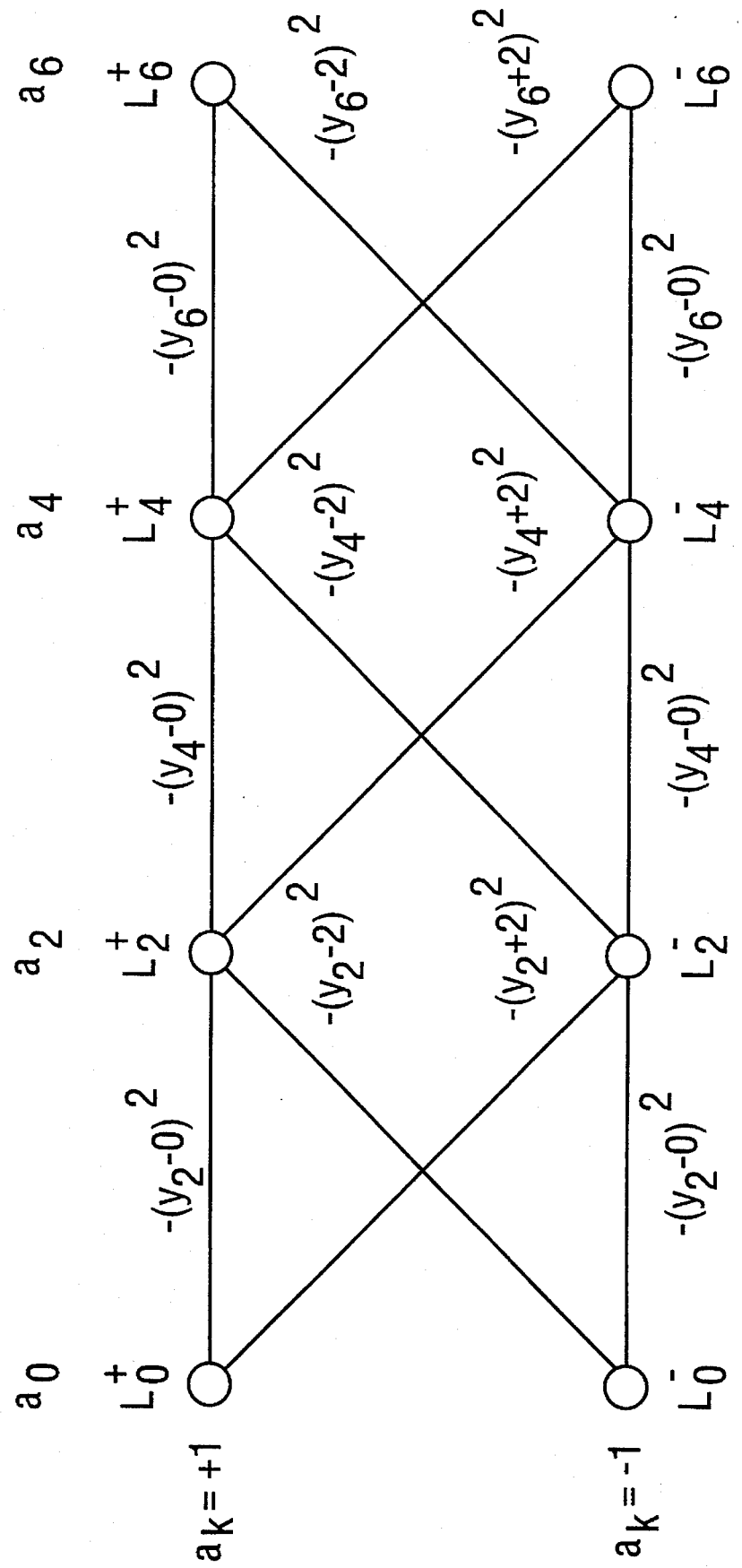
FIG. 10 is a trellis diagram of the state transition diagram shown in FIG. 9.

Subsequently, operation thereof will be explained. A pair of circuits (for example, arithmetic circuits 102 and 103 shown in FIG. 6(b)) for calculating a partial response (1,−1), for example, are used with being interleaved to thereby supply the reproduced data to the processing circuits 10 and 20.

On the other hand, the change-over circuit 1 supplies a selection signal (even/odd$^{-1}$) (shown in FIG. 4(b)) alternately changed to an H level (logic 1)/an L level (logic 0) in accordance with a timing of a leading edge of the clock (shown in FIG. 4(a)) as shown in FIG. 4 to the shift register arithmetic circuit 2 and the processing circuits 10 and 20. The processing circuits 10 and 20 respectively process the reproduced data of the even sample string and the odd sample string input through switches 14 and 24 at the timing of the selection signal (even/odd-1) supplied from the change-over circuit 1 similarly to processing explained with reference to FIG. 12, respectively outputting the signals merge_even and data_even and the signals merge_odd and data_odd from the comparing circuits 13 and 23 to the shift register arithmetic circuit 2 in accordance with the above-mentioned Tables 1 and 2.

When the selection signal (even/odd$^{-1}$) supplied from the change-over circuit 1 indicates the logic 1 (when it is at H level), the shift register arithmetic circuit 2 carries out processing on the basis of the signals merge_even and data_even output from the comparing circuit 13 at the timing shown in FIG. 4(c). When the selection signal (even/odd$^{-1}$) supplied from the change-over circuit 1 indicates the logic 0 (when it is at L level), the shift register arithmetic circuit 2 carries out processing on the basis of the signals merge_odd and data_odd output from the comparing circuit 23 at the timing shown in FIG. 4(d).

The shift register arithmetic circuit 2 generates in signal generating circuits (30a to 30d) the four signals (input_a, input_b, input_c and input_d) shown in the following equations from the selection signal (even/odd$^-$) supplied from the change-over circuit 1, the signals merge_even and data_even output from the comparing circuit 13 and the signals merge_odd and data_odd output from the comparing circuit 23.

To speak concretely, the circuits 30a to 30d are the circuits shown in FIGS. 3(a) to 3(d).

input_a=(even/odd$^{-1}$=1)*merge_even+(even/odd$^{-1}$=0)*merge_odd input_b=(even/odd$^{-1}$=1)*merge_even input_c=(even/odd$^{-1}$=0)*merge_odd input_d=0 where symbols * and + represent conjunction and disjunction, respectively, further (even/odd$^{-1}$=1) has a logic 1 when the signal even/odd$^{-1}$ is a logic 1 (in case of the timing of the even string sample) and has a logic 0 when the signal even/odd$^{-1}$ is a logic 0 (in case of the timing of the odd string sample), and (even/odd$^{-1}$=0) has a logic 0 when the signal even/odd$^{-1}$ is a logic 1 and has a logic 1 when the signal even/odd$^{-1}$ is a logic 0.

Accordingly, the signal input_b has a value which is valid only at the timing of the even string sample and the same as the signal merge (merge_even) output from the comparing circuit 13, and the signal input_c has a value which is valid only at the timing of the odd string sample and the same as the signal merge (merge_odd) output from the comparing circuit 23. Further, the signal input_a has the same value as the signal merge (merge_even) output from the comparing circuit 13 at the timing of the even string sample and has the same value as the signal merge (merge_odd) output from the comparing circuit 23 at the timing of the odd string sample. The signal input_d always has a value 0.

Summarization of the above equations is as follows.
(1) as to the signal input_a
① if even/odd$^{-1}$ (hereinafter referred to as e/ō)=1 and merge_e =1, then input_a=1.
② if e/ō=1 and merge_e=0, then input_a=0.
③ if e/ō=0 and merge_o=1, then input_a=1.
④ if e/ō=0 and merge_e=0, then input_a=0.
(2) as to the signal input_b
① if e/ō=1 and merge_e=1, then input_b=1.
② if e/ō=1 and merge_e=0, then input_b=0.
③ if e/ō=0, then input_b=0.
(3) as to the signal input_c
① if e/ō=0 and merge_o=1, then input_c=1.
② if e/ō=0 and merge_o=0, then input_c=0.
③ if e/ō=1, then input_c=0.
(4) as to the signal input_d
input_d=0 is always established.

The four signals input_a, input_b, input_c and input_d are respectively input to the flip-flops $Da_{-1}$ to $Dd_{-1}$ at the first stage of the shift register arithmetic circuit 2 (shown in FIG. 2).

The respective signals input_a, input_b, input_c and input_d respectively input to the flip-flops $Da_{-1}$ to $Dd_{-1}$ are sequentially latched by the succeeding stage flip-flops through the selectors.

If the signals supplied from the preceding stages of the shift registers of the series a to d are respectively expressed as in_a, in_b, in_c and in_d, then the selectors $Sa_j$, $Sb_j$, $Sc_j$ and $Sd_j$ (j=0, 1, ..., j (which is set as j=16 as described above in this embodiment)) output signals out_a, out_b, out_c and out_d in accordance with the following equations, respectively.

```
out_a= (even/odd⁻¹=1)*(merge_even=1)*(data_even=0)*in_c
      +(even/odd⁻¹=1)*((merge_even=1)*(data_even=0))⁻¹*in_a
      +(even/odd⁻¹=0)*(merge_odd=1)*(data_odd=0)*in_b
      +(even/odd⁻¹=0)*((merge_odd=1)*(data_odd=0))⁻¹*in_a
out_b= (even/odd⁻¹=1)*(merge_even=1)*(data_even=0)*in_d
      +(even/odd⁻¹=1)*((merge_even=1)*(data_even=0))⁻¹*in_b
      +(even/odd⁻¹=0)*(merge_odd=1)*(data_odd=1)*in_a
      +(even/odd⁻¹=0)*((merge_odd=1)*(data_odd=1))⁻¹*in_b
out_c= (even/odd⁻¹=1)*(merge_even=1)*(data_even=1)*in_a
      +(even/odd⁻¹=1)*((merge_even=1)*(data_even=1))⁻¹*in_c
      +(even/odd⁻¹=0)*(merge_odd=1)*(data_odd=0)*in_d
      +(even/odd⁻¹=0)*((merge_odd=1)*(data_odd=0))⁻¹*in_c
out_d= (even/odd⁻¹=1)*(merge_even=1)*(data_even=1)*in_b
      +(even/odd⁻¹=1)*((merge_even=1)*(data_even=1))⁻¹*in_d
      +(even/odd⁻¹=0)*(merge_odd=1)*(data_odd=1)*in_c
      +(even/odd⁻¹=0)*((merge_odd=1)*(data_odd=1))⁻¹*in_d
```

Symbols $()^{-1}$ represent an inversion of the results of the equation in parenthesis. That is, the symbols $()^{-1}$ has a value 0 when the logic in the parenthesis is 1 and has a value 1 when the logic in the parenthesis is 0.

Summarization of the above equations is as follows.
(1) as to the signal out_a
① the timing of the even sample
 (a) if merge_e=1 and data_e=0, then out_a=in_c.
 (b) if merge_e=0 or data_e=1, then out_a=in_a.
② the timing of the odd sample
 (a) if merge_o=1 and data_o=0, then out_a=in_b.
 (b) if merge_o=0 or data_o=1, then out_a=in_a.
(2) as to the signal out_b
① the timing of the even sample
 (a) if merge_e=1 and data_e=0, then out_b=in_d.
 (b) if merge_e=0 or data_e=1, then out_b=in_b.
② the timing of the odd sample
 (a) if merge_o=1 and data_o=1, then out_b=in_a.
 (b) if merge_o=0 or data_o=0, then out_b=in_b.
(3) as to the signal out_c
① the timing of the even sample
 (a) if merge_e=1 and data_e=1, then out_c=in_a.
 (b) if merge_e=0 or data_e=0, then out_c=in_c.
② the timing of the odd sample
 (a) if merge_o=1 and data_o=0, then out_c=in_d.
 (b) if merge_o=0 or data_o=1, then out_c=in_c.
(4) as to the signal out_d
① the timing of the even sample
 (a) if merge_e=1 and data_e=1, then out_d=in_b.
 (b) if merge_e=0 or data_e=0, then out_d=in_d.
② the timing of the odd sample
 (a) if merge_o=1 and data_o=1, then out_d=in_c.
 (b) if merge_o=0 or data_o=0, then out_d=in_d.

Similarly to the case explained with reference to FIG. 13, on the basis of the above equations, the shift register arithmetic circuit 2 selects a series of the serial shift register to survive (a correct path) in response to the signals merge_even and data_even supplied from the comparing circuit 10 and the signals merge_odd and data_odd supplied from the comparing circuit 20, and the data latched by the flip-flops of the selected series of the serial shift register are copied to the flip-flops of other series of the serial shift register to thereby effect the error correction based on the Viterbi decoding method.

Simultaneously, in the shift register arithmetic circuit 2, the XOR gates 31a to 31d calculate exclusive-ORs of outputs of the flip-flops $Da_{16}$ to $Dd_{16}$ at the last stages of the serial shift registers of the series a to d and outputs of the flip-flops $Da_0$ to $Dd_0$ thereof and then input the results to the selectors $Sa_1$ to $Sd_1$, respectively.

Further, exclusive-ORs of the outputs of the XOR gates 31a to 31d and outputs of the flip-flops $Da_5$ to $Dd_5$ of the serial shift registers of the series a to d are calculated by the XOR gates 32a to 32d and then input to the selectors $Sa_6$ to $Sd_6$, respectively. Exclusive-ORs of the outputs of the former XOR gates 31a to 31d and outputs of the flip-flops $Da_{12}$ to $Dd_{12}$, not shown, of the serial shift registers of the series a to d are calculated by the XOR gates respectively provided between the flip-flops $Da_{12}$ to $Dd_{12}$ and the selectors $Sa_{13}$ to $Sd_{13}$, not shown, and then input to the selectors $Sa_{13}$ to $Sd_{13}$, respectively.

Accordingly, the shift register arithmetic circuit 2 carries out the CRC operation based on the generating polynomial shown in equation (6) similarly to the case explained with reference to FIG. 16.

By the way, when the partial response (1,0,−1) is Viterbi-decoded, it is necessary to add a two-bit code for terminating a trellis to an end of a block (a bit string of a processing unit to be decoded) of the data (bit string) to be decoded. The two-bit code is generally added to the end of the block as code (1,1) in the form of the code before pre-coding.

The two-bit code for terminating the trellis is not necessary for the CRC operation. Accordingly, when two bit data which are added to the end of data block and correspond to the code (1,1) for terminating the trellis are respectively latched by the flip-flops $Da_{-1}$ to $Dd_{-1}$ and $Da_0$ to $Dd_0$ of the serial shift registers of the series a to d, the shift register arithmetic circuit 2 estimates the result of the CRC operation on the basis of the exclusive-ORs of 16 bits latched by any series of the flip-flops $Da_1$ to $Da_{16}$, $Db_1$ to $Db_{16}$, $Dc_1$ to $Dc_{16}$ and $Dd_1$ to $Dd_{16}$.

Figure 12:
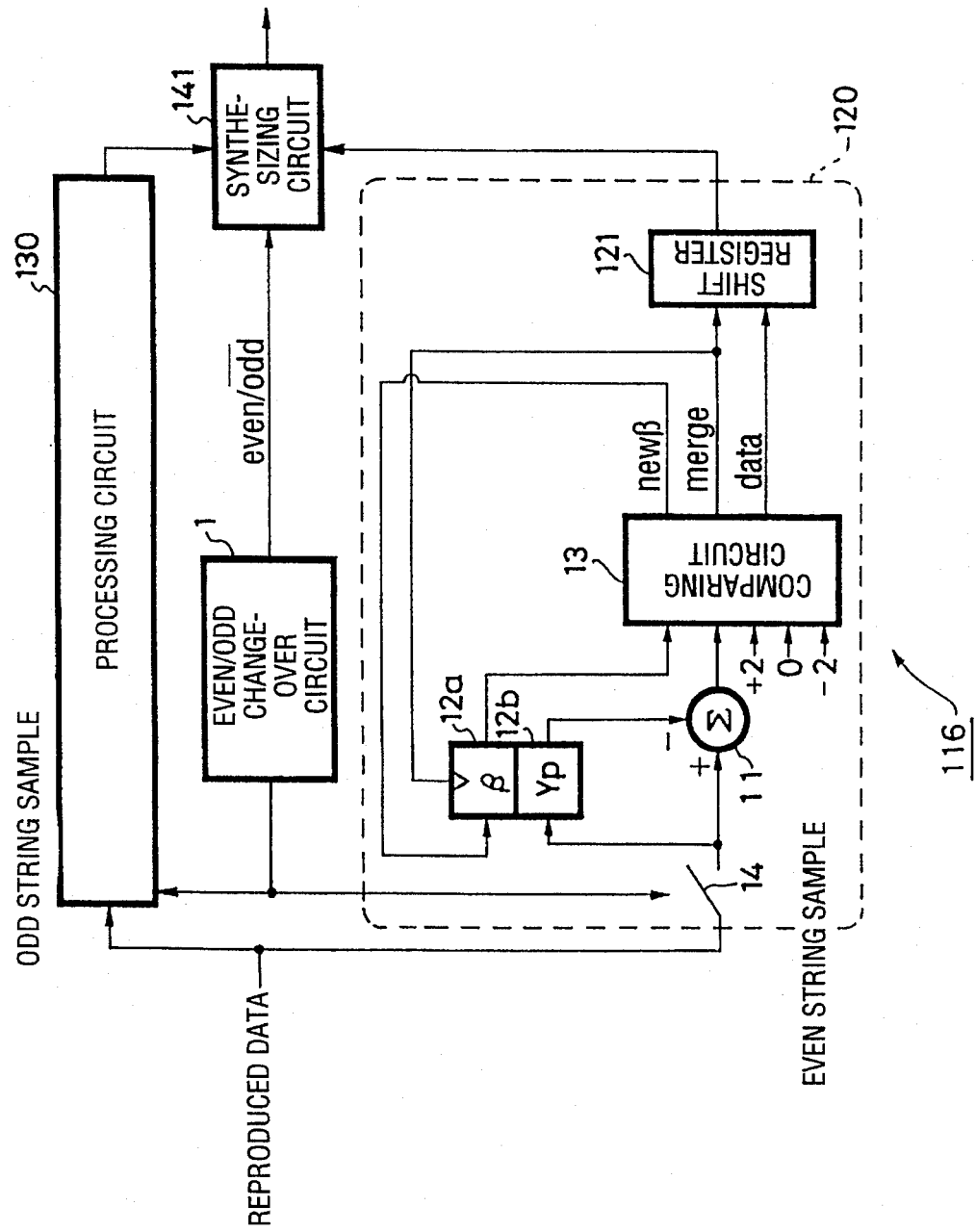
FIG. 12 is a block diagram showing construction of one example of a decoder 116 using the Viterbi algorithm.

When all the 16 bits latched by any series of the flip-flops $Da_1$ to $Da_{16}$, $Db_1$ to $Db_{16}$, $Dc_1$ to $Dc_{16}$ and $Dd_1$ to $Dd_{16}$ have values 0, the result of the CRC operation is regarded as one indicating that data have no error in the determining circuit 34 shown in FIG. 12, while when any of 16 bits does not have the value 0, the result of the CRC operation is regarded as one indicating that the data have error.

As described above, in order to carry out the CRC operation, the XOR gates for calculating the exclusive-ORs of the outputs of the flip-flops of the different series are disposed between the flip-flops connected in series which form the respective series of the serial shift registers for effecting the Viterbi decoding method. Therefore, when the generating polynomial of j order of the CRC code is used, the result of the CRC operation can be obtained within j−1 clocks after the last bit of the reproduced data block is input to the processing circuits 10 and 20 shown in FIG. 1.

Figure 5:
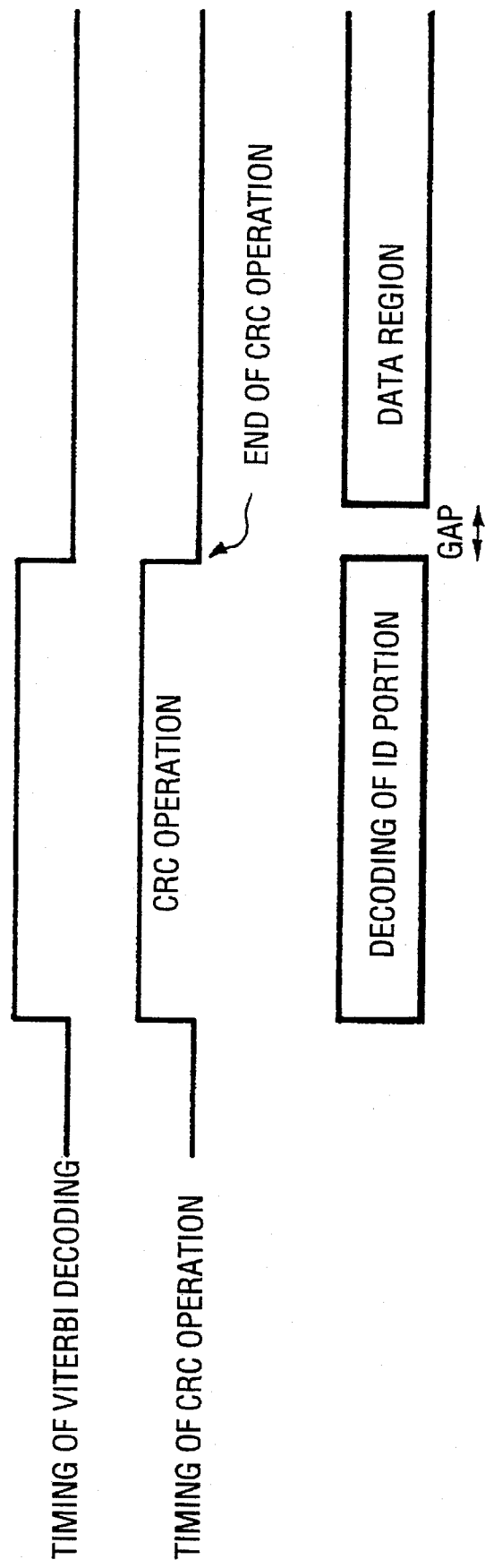
FIG. 5 is a timing chart used to explain a Viterbi decoding and a CRC operation in the embodiment shown in FIG. 1.

As shown in FIG. 5, the Viterbi decoding and the CRC operation are simultaneously performed, so that the delay time inevitably caused by the data decoding and the error correction can be drastically reduced and the gap provided between the ID portion and the data portion of the recording medium can be made smaller.

Accordingly, the data can be recorded on the recording medium with high density, and the highly reliable data can be reproduced from the recording medium recorded with high density.

The present invention can be applied to apparatus for recording and reproducing information on and from the magnetic recording medium such as the magnetic tape apparatus, the magnetic disc apparatus or the like, for example, as long as the apparatus employ the partial response system and employs the CRC code as the error correction code. Further, the present invention can be applied to apparatus for recording and reproducing information on and from an optical recording medium such as a magneto-optical disc apparatus, an optical disc apparatus, an optical card apparatus or the like.

While the generating polynomial of the CRC shown in equation (6) is used in this embodiment, equation capable of being used in the present invention is not limited to this equation and other equations can be used in the present invention. In this case, the shift register arithmetic circuit 2 may be arranged such that the number of the stages of the flip-flops thereof is increased or decreased and the number and insertion positions of the XORs are changed in response to a generating polynomial to be used.

I claim:

1. A circuit for concurrently performing a partial response maximum likelihood decoding, and an error correction calculation of a data stream in accordance with an algorithm characterized by a parameter j, the circuit comprising:

a plurality of serial shift registers, connected in parallel, each shift register including j+2 latch means, $D_1$ to $D_j$, connected in series for latching and shifting the data stream;

j+1 selector means, $S_0$ to $S_j$, wherein each selector means $S_i$, for i equal 0 to j, is connected between adjacent latch means $D_{i-1}$ and $D_i$ for switching a Sample of said data stream from an odd string sample to an even string sa.mple and vice versa, in response to a change-over signal, such that said shift register simultaneously processes the even string sample and the odd string sample of a processing result of a processing means on the basis of the changeover signal;

arithmetic means disposed between selected adjacent ones of the latch means to carry out the error correction calculation in accordance with a generating polynomial of an error detection code and calculates exclusive-ORs of outputs of said latch means.

2. The information reproducing apparatus claimed in claim 1, wherein said error correction calculation is a generating polynomial having a highest degree j and a result of said error correction calculation is estimated on the basis of values, whose number is smaller than j+2, of values latched by said j+2 latch means.

3. The information reproducing apparatus claimed in claim 2, wherein said shift register estimates a result of said error correction calculation on the basis of values latched by the latch means $D_j$.

4. The information reproducing apparatus claimed in claim 3, wherein said data stream is recorded on a recording medium by using a partial response class IV, and said shift register subjects said data to a maximum likelihood decoding and carries out said error detection calculation by using and interleaving processed results of pairs of processing means for performing processing with a partial response (1, −1).

5. The information reproducing apparatus claimed in claim 4, wherein said processing means calculates a differential metric from reproduced data and, on the basis of said differential metric, outputs as processing results a first flag indicating probability of state change and a second flag indicating that state has actually been changed.

6. The information reproducing apparatus claimed in claim 4, and further comprising change-over means for generating the changeover signal.

7. The information reproducing apparatus claimed in claim 6, wherein said maximum likelihood decoding is a Viterbi decoding.

8. The information reproducing apparatus claimed in claim 7, wherein said error detection code is a CRC code.

9. The information reproducing apparatus claimed in claim 8, wherein said shift register detects art error by judging whether or not all values latched by the latter j stage latch means of j+2 values latched by said j+2 stage latch means are the same.

* * * * *

UNITED STATES PATENT AND TRADEMARK OFFICE
CERTIFICATE OF CORRECTION

PATENT NO. : 5,600,664
DATED : February 4, 1997
INVENTOR(S) : Nobuhiro Hayashi

It is certified that error appears in the above-indentified patent and that said Letters Patent is hereby corrected as shown below:

Col. 20, line 12, "Sample" should read --sample--

Col. 20, line 13, please delete "sa.mple" and insert in place thereof --sample--;
Col. 20, line 62, please delete "art" and insert in place thereof --an--.

Signed and Sealed this

First Day of July, 1997

Attest:

BRUCE LEHMAN

Attesting Officer

Commissioner of Patents and Trademarks